(12) United States Patent
Christoph

(10) Patent No.: US 9,014,386 B2
(45) Date of Patent: *Apr. 21, 2015

(54) AUDIO ENHANCEMENT SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 574 days.

This patent is subject to a terminal disclaimer.

(21) Appl. No.: 13/372,097

(22) Filed: Feb. 13, 2012

(65) Prior Publication Data

US 2012/0177221 A1    Jul. 12, 2012

Related U.S. Application Data

(62) Division of application No. 11/410,538, filed on Apr. 25, 2006, now Pat. No. 8,116,481.

(51) Int. Cl.
*A61F 11/06* (2006.01)
*H04B 15/00* (2006.01)
*H03G 3/32* (2006.01)

(52) U.S. Cl.
CPC ....................................... *H03G 3/32* (2013.01)

(58) Field of Classification Search
CPC .......... G10K 11/1786; G10K 11/1784; G10K 11/1788; G10L 2021/02165
USPC ............................. 381/71.1, 94.9, 94.7, 94.1
See application file for complete search history.

(56) References Cited

U.S. PATENT DOCUMENTS 3,714,622 A   1/1973 Wilhelmsen
3,934,084 A   1/1976 Munson et al.
3,934,085 A   1/1976 Munson et al.
4,025,723 A   5/1977 Blackledge
4,223,181 A   9/1980 Simeau
(Continued)

FOREIGN PATENT DOCUMENTS

DE    3220758    12/1983    .......................... 3/20
DE    3320751    12/1984    .......................... 3/20
(Continued)

OTHER PUBLICATIONS

Härmä, Aki: "Linear Predictive Coding with Modified Filter Structures".
(Continued)

*Primary Examiner* — Vivian Chin
*Assistant Examiner* — Douglas Suthers
(74) *Attorney, Agent, or Firm* — O'Shea Getz P.C.

(57) ABSTRACT

A system is provided for enhancing a sound signal produced by an audio system in a listening environment by compensating for ambient noise in the listening environment. The system receives an electrical sound signal and generates a sound output therefrom. A total sound signal is sensed representative of the total sound level in the environment, where the total sound level includes the sound output and the ambient noise. The system extracts an ambient noise signal representative of the ambient noise from the total sound signal, using an adaptive filter with an adaptive step size, in response to the total sound signal and to a reference signal derived from the electrical sound signal. The system generates a control signal in response to the ambient noise signal and adjusts the sound output of the audio system to compensate for the ambient noise level in response to the control signal.

20 Claims, 14 Drawing Sheets

(56) References Cited

U.S. PATENT DOCUMENTS

| | | |
|---|---|---|
| 4,247,955 A | 1/1981 | Wiedemann |
| 4,254,303 A | 3/1981 | Takizawa |
| 4,297,527 A | 10/1981 | Pate |
| 4,306,115 A | 12/1981 | Humphrey |
| 4,380,824 A | 4/1983 | Inoue |
| 4,406,923 A | 9/1983 | Burne, III et al. |
| 4,409,435 A | 10/1983 | Ono |
| 4,438,526 A | 3/1984 | Thomalla |
| 4,461,025 A | 7/1984 | Franklin |
| 4,476,571 A | 10/1984 | Tokumo et al. |
| 4,479,237 A | 10/1984 | Sugasawa |
| 4,553,258 A | 11/1985 | Chainer et al. |
| 4,590,593 A | 5/1986 | Rodney |
| 4,598,417 A | 7/1986 | Deno |
| 4,628,526 A | 12/1986 | Germer |
| 4,636,586 A | 1/1987 | Schiff |
| 4,641,344 A | 2/1987 | Kasai et al. |
| 4,649,505 A | 3/1987 | Zinser, Jr. et al. |
| 4,672,674 A | 6/1987 | Clough et al. |
| 4,677,389 A | 6/1987 | Op de Beek et al. |
| 4,696,030 A | 9/1987 | Egozi |
| 4,696,044 A | 9/1987 | Waller, Jr. |
| 4,718,099 A | 1/1988 | Hotvet |
| 4,723,294 A | 2/1988 | Taguchi |
| 4,731,850 A | 3/1988 | Levitt et al. |
| 4,751,739 A | 6/1988 | Serikawa et al. |
| 4,769,847 A | 9/1988 | Taguchi |
| 4,823,391 A | 4/1989 | Schwartz |
| 4,827,458 A | 5/1989 | D'Alayer de Costemore D'Arc |
| 4,837,834 A | 6/1989 | Allie |
| 4,852,175 A | 7/1989 | Kates |
| 4,864,246 A | 9/1989 | Kato et al. |
| 4,887,299 A | 12/1989 | Cummins et al. |
| 4,891,605 A | 1/1990 | Tirkel |
| 4,953,221 A | 8/1990 | Holly et al. |
| 4,956,867 A | 9/1990 | Zurek et al. |
| 4,965,834 A | 10/1990 | Miller |
| 5,018,202 A | 5/1991 | Takahashi et al. |
| 5,018,205 A | 5/1991 | Takagi et al. |
| 5,034,984 A | 7/1991 | Bose |
| 5,048,091 A | 9/1991 | Sato et al. |
| 5,068,834 A | 11/1991 | Fromont |
| 5,077,799 A | 12/1991 | Cotton |
| 5,081,682 A | 1/1992 | Kato et al. |
| 5,089,997 A | 2/1992 | Pecukonis |
| 5,107,539 A | 4/1992 | Kato et al. |
| 5,117,401 A | 5/1992 | Feintuch |
| 5,126,681 A | 6/1992 | Ziegler, Jr. et al. |
| 5,131,047 A | 7/1992 | Hashimoto et al. |
| 5,146,505 A | 9/1992 | Pfaff et al. |
| 5,146,507 A | 9/1992 | Satoh et al. |
| 5,204,971 A | 4/1993 | Takahashi et al. |
| 5,208,866 A | 5/1993 | Kato et al. |
| 5,226,016 A | 7/1993 | Christman |
| 5,243,661 A | 9/1993 | Ohkubo et al. |
| 5,255,324 A | 10/1993 | Brewer et al. |
| 5,267,322 A | 11/1993 | Smith et al. |
| 5,291,558 A | 3/1994 | Ross |
| 5,293,425 A | 3/1994 | Oppenheim et al. |
| 5,311,446 A | 5/1994 | Ross et al. |
| 5,325,437 A | 6/1994 | Doi et al. |
| 5,410,605 A | 4/1995 | Sawada et al. |
| 5,416,846 A | 5/1995 | Tamura et al. |
| 5,434,922 A | 7/1995 | Miller et al. ............... 381/57 |
| 5,434,926 A | 7/1995 | Watanabe et al. |
| 5,450,494 A | 9/1995 | Okubo et al. |
| 5,485,523 A | 1/1996 | Tamamura et al. |
| 5,530,761 A | 6/1996 | D'Alayer de Costemore d'Arc |
| 5,539,832 A | 7/1996 | Weinstein et al. |
| 5,615,270 A | 3/1997 | Miller et al. |
| 5,635,903 A | 6/1997 | Koike et al. |
| 5,666,426 A | 9/1997 | Helms |
| 5,699,424 A | 12/1997 | Hirano |
| 5,757,937 A | 5/1998 | Itoh et al. |
| 5,774,565 A | 6/1998 | Benning et al. |
| 5,778,073 A | 7/1998 | Busching et al. |
| 5,796,847 A | 8/1998 | Kaihotsu et al. |
| 5,872,852 A | 2/1999 | Dougherty |
| 5,884,992 A | 3/1999 | Taylor et al. |
| 6,061,455 A | 5/2000 | Hadley et al. |
| 6,072,881 A | 6/2000 | Linder |
| 6,078,670 A | 6/2000 | Beyer |
| 6,098,036 A | 8/2000 | Zinser, Jr. et al. |
| 6,163,608 A | 12/2000 | Romesburg et al. |
| 6,351,731 B1 | 2/2002 | Anderson et al. |
| 6,370,254 B1 | 4/2002 | Gore et al. |
| 6,415,253 B1 | 7/2002 | Johnson |
| 6,487,529 B1 | 11/2002 | Miet |
| 6,529,605 B1 | 3/2003 | Christoph ............... 381/56 |
| 6,868,162 B1 | 3/2005 | Jubien et al. |
| 7,302,062 B2 | 11/2007 | Christoph |
| 2001/0055400 A1 | 12/2001 | Lubbe et al. |
| 2003/0053639 A1 | 3/2003 | Beaucoup et al. |
| 2003/0128851 A1 | 7/2003 | Furuta |
| 2003/0215013 A1 | 11/2003 | Budnikov |
| 2004/0057586 A1 | 3/2004 | Licht |
| 2004/0076302 A1 | 4/2004 | Christoph ............... 381/57 |
| 2004/0125962 A1 | 7/2004 | Christoph ............... 381/59 |
| 2005/0008170 A1 | 1/2005 | Pfaffinger et al. |
| 2005/0013443 A1 | 1/2005 | Marumoto et al. ........ 381/56 |
| 2005/0015252 A1 | 1/2005 | Marumoto |
| 2005/0058301 A1 | 3/2005 | Brown |
| 2005/0075870 A1 | 4/2005 | Chamberlain |

FOREIGN PATENT DOCUMENTS

| | | | |
|---|---|---|---|
| DE | 3322055 | 12/1984 | ............... 3/20 |
| DE | 3338413 | 5/1985 | ............... 3/20 |
| DE | 4204385 | 8/1993 | ............... 3/20 |
| DE | 19736699 | 2/1999 | ............... 3/24 |
| EP | 0 017 519 | 10/1980 | ............... 11/30 |
| EP | 0 319 777 | 6/1989 | ............... 3/32 |
| EP | 0319777 | 6/1989 | |
| EP | 0 623 995 | 11/1994 | ............... 3/32 |
| GB | 2 013 051 | 8/1979 | ............... 3/20 |
| GB | 2 257 317 | 1/1993 | ............... 3/32 |
| JP | 61108212 | 5/1986 | |
| JP | 62092607 | 4/1987 | ............... 3/32 |
| JP | 04047705 | 2/1992 | ............... 5/16 |
| JP | 04070106 | 3/1992 | ............... 3/32 |
| JP | 4094204 | 3/1992 | ............... 3/32 |
| JP | 04302204 | 10/1992 | ............... 3/32 |
| JP | 04365210 | 12/1992 | ............... 3/32 |
| JP | 05037270 | 2/1993 | ............... 3/32 |
| JP | 05220361 | 8/1993 | ............... 71/68 |
| JP | 05259779 | 10/1993 | ............... 3/32 |
| JP | 06069742 | 3/1994 | ............... 3/32 |
| JP | 09-116469 | 5/1997 | |
| JP | 9116361 | 5/1997 | ............... 3/32 |
| JP | 10-206180 | 8/1998 | |
| JP | 11225030 | 8/1999 | ............... 3/32 |
| JP | 2001-195085 | 7/2001 | |
| JP | 2005-086284 | 3/2005 | |
| WO | WO 00/04636 | 1/2000 | ............... 9/18 |
| WO | WO 2004/010191 | 1/2004 | ............... 6/43 |

OTHER PUBLICATIONS

Härmä, Aki: "Evaluation of a Warped Linear Predictive Coding Scheme," Laboratory of Acoustics and Audio Signal Processing.

Härmä et al.: "A Comparison of Warped and Conventional Linear Predictive Coding".

Härmä et al.: "Frequency-Warped Signal Processing for Audio Applications," Journal of the Audio Engineering Society, Audio Engineering Society, vol. 48, No. 11, Nov. 2000.

ISO/IEC JTC1/SC29/WG11 MPEG, IS11172-73, "Coding of Moving Pictures and Associated Audio," International Organisation for Standardisation, Nov. 11, 1994, pp. 1-104.

Johnston, J.D.: "Perceptual Transform Coding of Wideband Stereo Signals", Proc. ICASSP'99, pp. 2524-2527.

Johnston, J.D.: "Transform Coding of Audio Signals Using Perceptual Noise Criteria", IEEE Journal on Selected Areas in Communications 6, pp. 314-323.

(56) References Cited

OTHER PUBLICATIONS

Zwicker et al.: "Psychoacoustics, Facts and Models", Springer Series in Information Sciences, $2^{nd}$ edition, pp. 61-110.

Weiss et al.: "On Adaptive Filtering in Oversampled Subbands", ISBN 3/ 8265/45/66/4, 1998, pp. 139-166.

Raad et al.: "Audio Coding Based on the Modulated Lapped Transform (MLT) and Set Partitioning in Hierarchical Trees", Proc. $6^{th}$ World Multiconference on Systemics Cybernetics and Informatics (SCI 2002), 3:303-306, Jul. 2002, Orlando FL USA.

Dobson, Richard: "A Dictionary of Electronic and Computer Music Technology", pp. 158-185, Oxford University Press 1992.

Härmä, Aki: "Linear Predictive Coding with Modified Filter Structures", IEEE Trans. Speech Audio Processing, Nov. 2001.

Härmä, Aki: "Evaluation of a Warped Linear Predictive Coding Scheme," Proc. IEEE Int. Conf. Acoustics, Speech, and Signal Processing, vol. II, pp. 897-900, Jun. 2000.

Härmä et al.: "A Comparison of Warped and Conventional Linear Predictive Coding", IEEE Trans. Speech Audio Processing, Jul. 2001.

Johnston, J.D.: "Transform Coding of Audio Signals Using Perceptual Noise Criteria", IEEE Journal on Selected Areas in Communications 6, pp. 314-323, Feb. 1988.

AUDIO ENHANCEMENT SYSTEM

CLAIM OF PRIORITY

This patent application is a divisional of U.S. application Ser. No. 11/410,538 filed Apr. 25, 2006 now U.S. Pat. No. 8,116,481.

FIELD OF THE INVENTION

This invention relates to a system for improving the sound reproduced by an audio system in a listening environment such as a vehicle and, in particular, to a system which compensates for noise outside the audio system.

RELATED ART

When music or speech is reproduced, for example, in a vehicle, the signal is typically corrupted by external acoustic noise present in the vehicle. This noise may result from and is dependent upon vehicle speed, road condition, weather and condition of the vehicle. The presence of such noise results in a situation where soft sounds of interest are hidden, the perceived loudness is reduced and the intelligibility of the signal is lessened. The vehicle driver and/or passengers may compensate for increased external noise by increasing the volume of the audio system. However, when the vehicle speed decreases or another source of external noise is alleviated, the audio system's volume will be too high, requiring the user to reduce it. To overcome this, U.S. Pat. Nos. 5,434,922 and 6,529,605 propose an enhanced dynamic volume control (DVC) system which extracts the noise signal from a signal provided by a sensor (e.g., a sensing microphone) in the listening environment and calculates a control signal therefrom. This control signal is used to control the volume and/or dynamics of the desired signal (e.g., the music).

A DVC system extracts the noise signal from mixed signals derived from a sensor (e.g., a microphone). The mixed signals comprise music components (i.e., the desired signal), voice components and noise components. The noise component is intended to be used solely for obtaining the control signal for the volume or dynamics of the desired signal. It is desired that the other components have no effect on the derivation of the control signal. Otherwise the system would respond to voice signals or control itself through the music, which results in a gain chase situation (i.e., direct feedback). Such a gain chase situation could lead to instability in the entire audio system.

The music signal is typically extracted from the sensor signal using an adaptive filter. The voice signal left in the remaining signal mixture is then masked out using a "voice activity detector" (VAD). The VAD operates continuously in the time range—i.e., in a broadband manner—and is typically implemented by an averaging unit with predetermined increments and decrements. That is, as long as the input signal is larger than the output signal, the VAD increases its output signal by a fixed increment, or reduces its output signal by a fixed decrement whenever the input signal is less than the VAD output signal. In this way, the VAD utilizes the different stationary properties of the voice and noise signals. The noise signal is strongly (broadband) smoothed so that the VAD output signal (i.e., the control signal), even if somewhat delayed, reaches a stationary final value, which approximately corresponds to the average power of the noise signal in the sensor signal. Depending on the configured volume or selected equalizing, which mainly refers in this instance to the bass setting, the music signal more or less penetrates the noise signal—that is, the louder the desired signal (e.g., the music signal) is played or the higher the bass controller is set, the greater the share of the music signal that passes unfiltered through the adaptive filter. This can lead to the undesirable gain chase situation described above.

It has been found that the adaptive filter works relatively better (i.e., permits less of the desired music signal to pass through it) if the signals have a narrower bandwidth. For this reason, the DVC system mostly works with strongly undersampled signals, which reduces the implementation complexity, but leads to a control signal which is derived solely from the low-frequency noise component and is then applied in a broadband manner to control the volume or dynamics. Since low-frequency noise signals typically dominate in vehicles—the field for which most DVC systems are primarily designed—the spectral limitation described above can only actually be considered in this context. Nonetheless, the solution is not fully ideal and could lead to overlapping effects in certain circumstances, which is why a broadband solution is preferable. Although the risk of gain chase is reduced through limiting the bandwidth, it is not fully eliminated.

One way of completely avoiding gain chase is to upward-limit the control signal in accordance with the existing power of the desired signal, which is implemented in common systems in the form of an anti-gain chase function. This function permits the control signal, provided the desired signal is below a specific minimum threshold value, to pass through the filter without being changed, but limits the control signal to a maximum value specified by another function if the power of the desired signal rises above the threshold, and blocks further control once the desired signal has exceeded a maximum threshold—i.e., the control signal is then replaced by zero. The control signal modified in this way can then be used to alter the volume and/or dynamics of the desired signal using a compressor. However, the control signal is, nevertheless, fully dependent on the mean power of the currently existing noise signal but does not consider its spectral distribution or coloring.

In this regard, "dynamic equalizer control" (DEC) systems are considered successors to DVC systems. However, one aspect that hinders the transition from DVC to DEC systems is the limited bandwidth with which DVC systems work. The reason why the bandwidth is limited is primarily to lessen the risk of gain chase and additionally to reduce the implementation costs.

It is already known from the DVC system how to calculate the required signal from a microphone signal for use as a loudness control value (i.e., volume). However, it is also evident that a straightforward volume control does not represent the most desirable solution because it does not consider the spectral distribution of the noise signal. Methods in both the time and spectral domains are known with which the spectral coloring of the noise can be integrated into the processing of the required signal using adaptive equalizing as illustrated above in the DEC system. In particular, the problems associated with noisy voice signal components in the microphone signal are given special attention. However, other difficulties relating to both the DVC and DEC systems are also disregarded as before.

What is needed is an improved system which automatically compensates for the noise level in a listening environment in the time domain.

SUMMARY OF THE INVENTION

A system for enhancing the sound signal produced by an audio system in a listening environment by compensating for ambient noise in the listening environment is provided. The system produces an electrical sound signal and generates a sound output therefrom to obtain a total sound signal representative of the total sound level in the environment. The total sound level includes both the sound output from the audio system and the ambient noise within the environment. The system extracts an ambient noise signal representative of the ambient noise in the environment from the total sound signal and to a reference signal derived from the electrical sound signal. The system may extract the ambient noise signal using an adaptive filter with an adaptive step size. The system generates a control signal in response to the ambient noise signal and adjusts the sound output of the audio system to compensate for the ambient noise level in response to the control signal. A step size is calculated for controlling the adaptive step size of the adaptive filter.

The other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
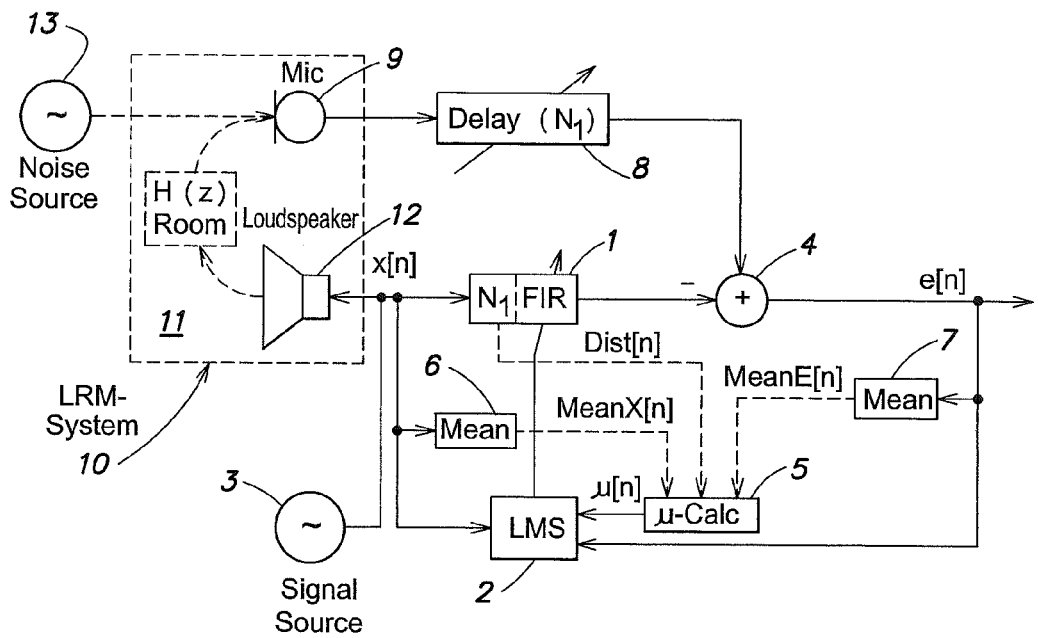
FIG. 1 is a block diagram illustration of an adaptive FIR filter with an adaptation step size.

In all the adaptive filters presented thus far, which have the effect of removing the desired signal (the source signal, e.g., music, speech, et cetera) as much as possible from the microphone signal, a fixed adaptation step size expressed by $\mu$ was used. This does not represent the most desirable situation, but instead reflects a compromise between stability and adaptation speed. Provided it can be assured that the desired signal is above the noise signal, using a fixed adaptation step size is acceptable. However, should the opposite situation apply to the signals, even if only for a brief period, the estimated loudspeaker/room microphone (LRM) transfer function is corrupted.

As a consequence, the estimated noise level incorrectly rises due to the desired signal components that are now considered. This situation is unacceptable because it can lead to problems in unfavorable circumstances. The reason for the exhibited behavior is the desired signal (e.g., the sound signal) serves as a test (or reference) signal with which the LRM transfer function is estimated using the adaptive filter. If the noise signal component is now greater than the desired signal component in the microphone signal, the room can no longer be correctly analyzed. The result is an LRM model comprising fully randomly assembled filter coefficients that cannot be iteratively reordered until the signal for measuring the room is above the noise signal. This requires some time to occur, during which the estimated transfer function is incorrect, and which constitutes a relatively major error in the removal of the desired signal component from the microphone signal.

The behavior of the adaptive filter in such situations is as follows: once the noise component becomes greater than the required signal component, the current LRM estimation—which exists as a set of filter coefficients—is frozen until the correct relationships apply once more. It is assumed that the LRM system changes relatively slightly or not at all during this time, as proved in practice. Moreover, the current adaptation success, as represented by the value of the system distance, has to be considered along with the present signal-to-noise ratio (SNR) value.

The system distance indicates the extent to which the current model differs from the one that actually exists, that is, it gives a measure of how much the adaptive filter has already approached the desired value. If the distance between the estimated and existing acoustic models is small, then the system distance is likewise small. Consequently, the adaptation step size is reduced to approach the desired model even more closely and to increasingly consolidate the model to be more resistant to brief occurrences of noise.

To estimate the system distance, a defined delay is introduced, for example, into the microphone signal branch. The delay is estimated by the adaptive filter using delayed filter coefficients. If the adaptive filter is properly configured, the coefficients assume the value zero. If the filter is instead improperly configured, the coefficients assume a non-zero value that varies in a direct relationship to the existing noise, thereby enabling conclusions regarding both the success of the adaptation and the system distance to be made. Generally, what is required is a small number of coefficients whose sum provides a value for the current system distance.

Referring to FIG. 1, an adaptive finite impulse response (FIR) filter with an adaptation step size, $\mu[n]$, includes an FIR filter core 1 controllable by a Least Mean Square (LMS) adaptation unit 2. The LMS unit 2 receives as an input signal a source signal x[n] from a signal source 3 (e.g., a CD player, radio, etc.), an error signal e[n] from a subtraction unit 4, and an adaptation step size µ[n] from a step size calculation unit 5. The step size calculation unit 5 may be a mean source signal Mean X[n], an estimated system distance Dist[n] supplied by the FIR filter core 1, and a mean error signal Mean E[n]. The signals Mean X[n] and Mean E[n] are each provided by a corresponding averaging unit 6, 7, respectively. The subtraction unit 4 further receives via a delay unit 8 a signal from a microphone 9, which is part of a loudspeaker-room-microphone (LRM) system 10. The LRM system 10 is located in a room 11 having a transfer function $H_{Room}(Z)$, in which the microphone 9 and a loudspeaker 12 supplied with the source signal x[n] are arranged. The microphone 9 receives acoustic signals from the loudspeaker 12 filtered by the transfer function $H_{Room}(z)$, along with noise signals from at least one noise source 13 outside (as shown) and/or inside (not shown) the room 11.

To calculate the SNR value, both the source signal x[n] and the resulting output signal of the adaptive filter—that is, the error signal e[n] are recursively determined using a simple first order Infinite Impulse Response (IIR) low-pass filter.

The estimated adaptation step size, µ[n], can be calculated as follows:

$$\mu[n] = \frac{MeanX[n] * Dist[n]}{MeanE[n]} \quad (1)$$

where the estimated system distance is given by the following equation:

$$Dist[n] = \frac{1}{N_t} * \sum_{n=1}^{N_t} |w[n]| \quad (2)$$

The expression $$\frac{MeanX[n]}{MeanE[n]}$$

in equation 1 corresponds to the ratio of the signal-to-noise ratio (SNR) value to the sampling time n. Thus, equation 1 can also be expressed as follows:

$$\mu[n]=Dist[n]*SNR[n] \quad (3)$$

which represents a relatively desirable adaptation step size at the sampling time n.

The use of the DVC system is usually restricted to the lower spectral range, but even this range is generally not emitted solely from one loudspeaker, but from a number of loudspeakers located at different positions within the listening room. As a consequence, the source signal played through the considered loudspeaker, representing the reference signal by, $x_x[n]$, which is folded with the room impulse response between the source signal and the microphone, affects the composite signal recorded by the microphone.

Figure 2:
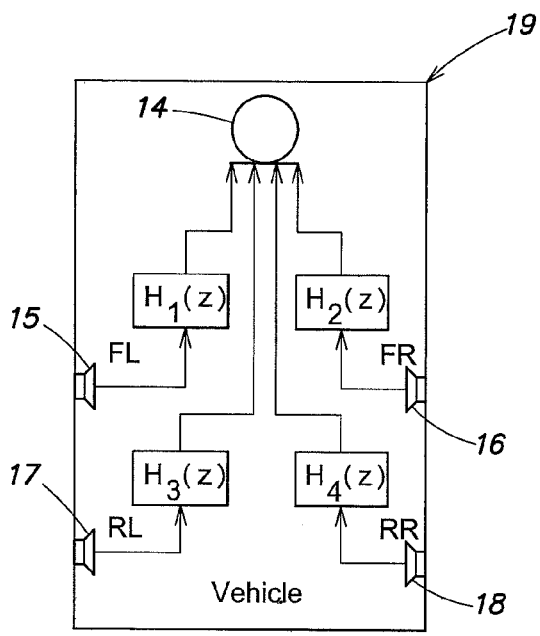
FIG. 2 is a block diagram illustration of a four-speaker/one-microphone arrangement.

FIG. 2 is an example of a four-speaker/one-microphone arrangement. The arrangement comprises a microphone 14 and four loudspeakers 15-18 arranged in the front left (FL), front right (FR), rear left (RL), and rear right (RR) of a room 19, which in the present exemplary case is the interior of a vehicle. Between each of the loudspeakers 15-18 and the microphone 14 is a room transfer function $H_1(z)$, $H_2(z)$, $H_3(z)$, and $H_4(z)$, respectively. Although in known DVC systems the different source signals are computed through simple addition and the resulting composite signal is used as a reference signal x[n] for the adaptive filter, the effects of the various room transfer functions still remain unconsidered. For example, if a system comprising four loudspeakers and one microphone as in the present example is considered, all four room transfer functions $H_1(z)$, $H_2(z)$, $H_3(z)$, and $H_4(z)$ between the loudspeakers 15-18 and the microphone 14 are considered. Until now, a single adaptive filter was used to remove the required (additive) signal from the microphone signal. In that situation, the adaptive filter did do no more than reflect the mean value of the four existing transfer functions.

The transfer functions with the strongest signal component, which normally stem from the loudspeakers nearest the microphone, have greater impact on the mean calculation than the weaker functions, derived mostly from loudspeakers positioned further away. This system functions relatively well on average, but still appears to be inadequate for a broader range of applications. To improve the system, the system of FIG. 2 having the four different loudspeakers 15-18 and the microphone 14 is considered. The composition of the resulting composite reference signal x[n] can be improved by considering in the calculation of the additive reference signal at least the different signal delay times and amplitudes resulting from the different distances of the loudspeakers 15-18 from the microphone 14. Beginning with the nearest loudspeaker to the microphone 14, which is taken as a reference point, the additional (acoustic) signal delays and attenuations in relation to the reference point are determined.

Figure 3:
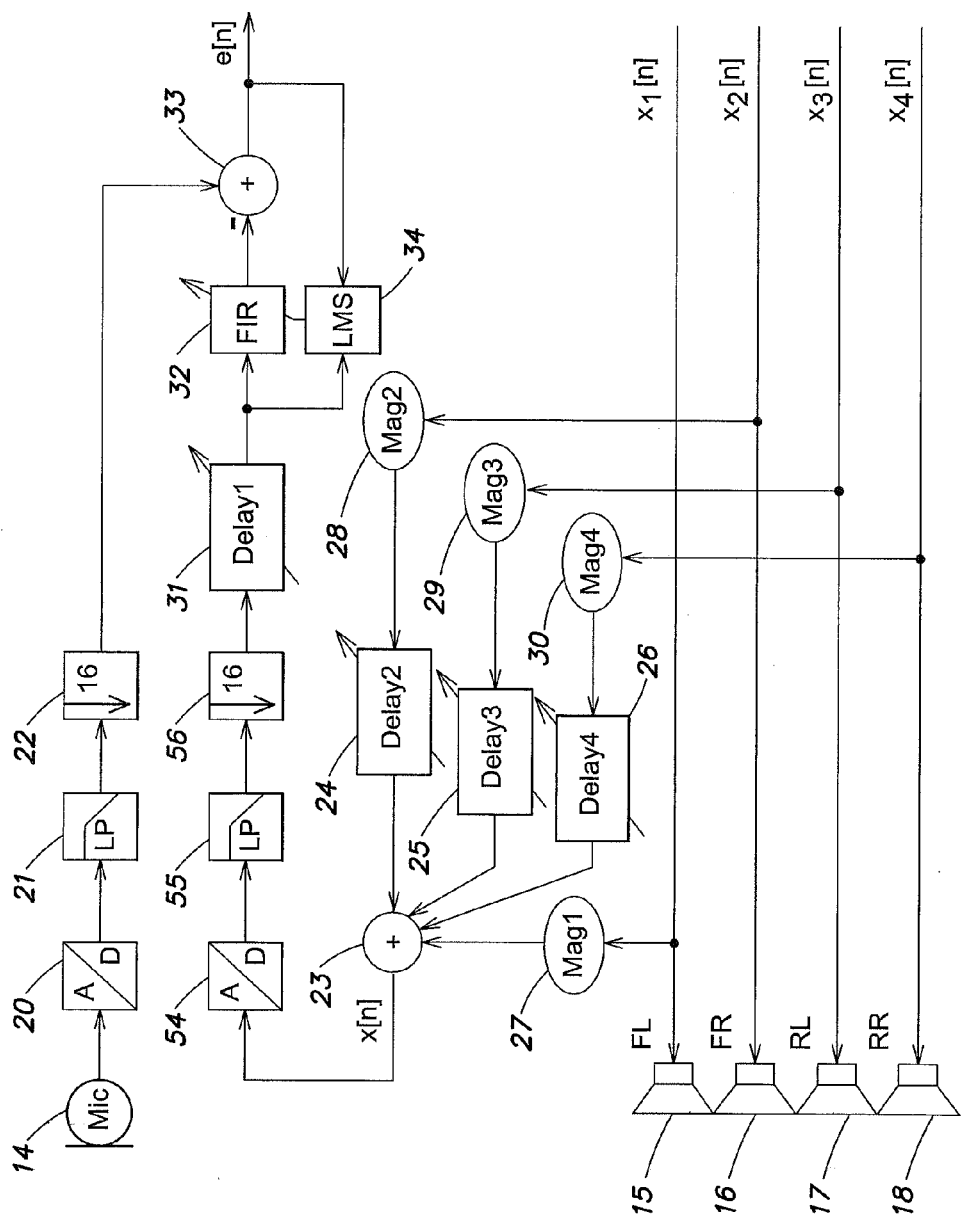
FIG. 3 is a block diagram illustration of a DVC system with an improved composition of the additive reference signal.

FIG. 3 illustrates a DVC system using an improved composition of the composite reference signal. The system of FIG. 3 comprises the microphone 14 (as in FIG. 2) connected to an analog-to-digital (AD) converter 20 for converting an analog signal from the microphone 14 into a digital signal. The digital signal is input to a low pass (LP) filter 21 serving as an anti-aliasing filter for a subsequent sample rate conversion unit 22 which changes the sample rate by, for example, 16. The composite reference signal x[n] which is the sum of individual source (reference) signals $x_1[n]$, $x_2[n]$, $x_3[n]$, and $x_4[n]$, each supplied to the respective loudspeaker 15-18, is provided by an adder unit 23. The source signals $x_2[n]$, $x_3[n]$, and $x_4[n]$ each are supplied to the adder 23 via a delay 24 ("Delay 2"), 25 ("Delay 3"), and 26 ("Delay 4"), respectively, and a corresponding attenuation unit 28 ("Mag2"), 29 ("Mag3"), and 30 ("Mag4"), respectively. The source signal $x_1[n]$ is supplied to the adder 23 directly via an attenuation unit 27 ("Mag1").

Figure 6:
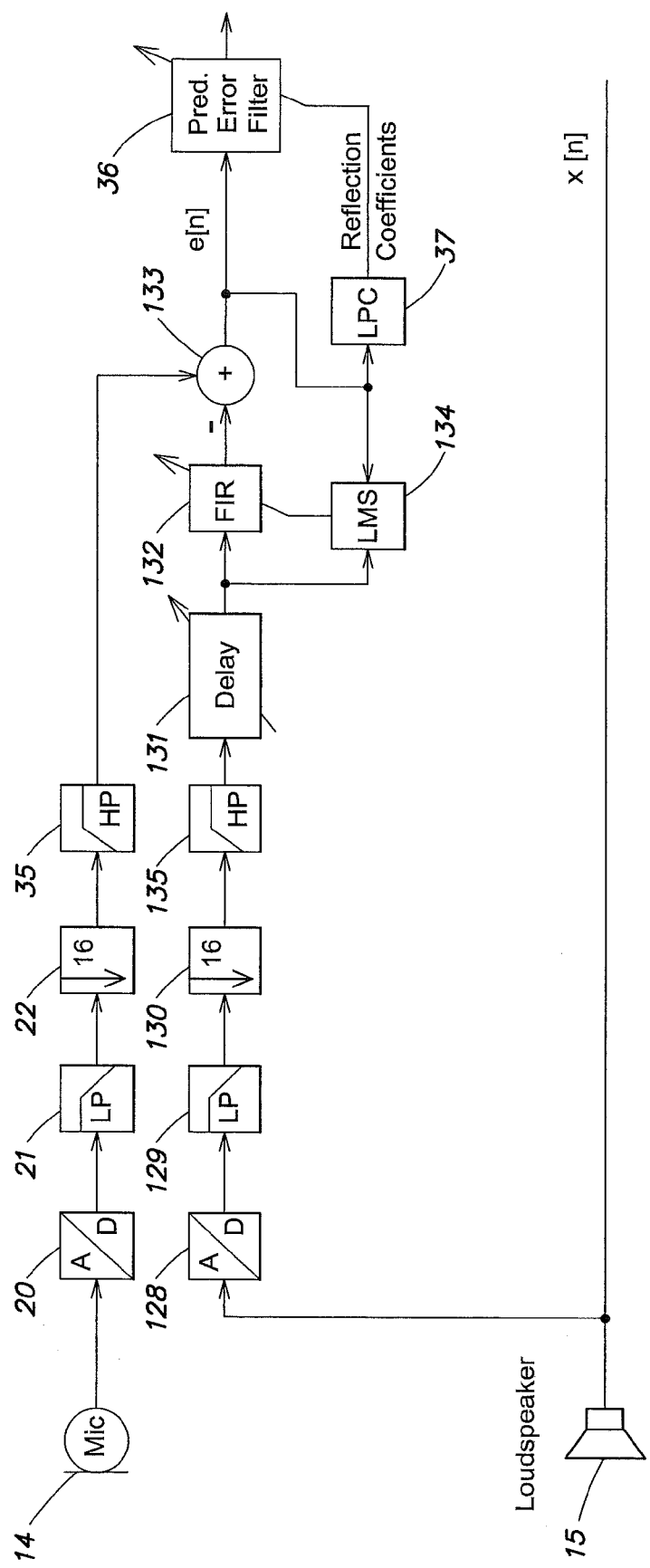
FIG. 6 is block diagram illustration of the use of a whitening filter in place of a simple high-pass filter for spectral smoothing of the noise signal.

An AD converter 54 is connected to the output of the adder unit 23 for converting the analog additive reference signal x[n] into a digital signal which is fed into a LP filter 55 serving as an anti-aliasing filter for a subsequent sample rate conversion unit 56. The output signal of the sample rate conversion unit 56 is fed via a delay unit 31 into an FIR filter core 32 and a LMS filter control unit 34 for controlling the FIR filter core 32. The output of the FIR filter core 32 is connected to one input of a subtraction unit 33, while a second input of the subtraction unit 33 is connected to the output of the sample rate conversion unit 22. The subtraction unit 33 outputs the error signal e[n], which is fed back to the filter control unit 34 for a comparison with the delayed reference signal. The error signal e[n] may also be supplied to other units such as, for example, a predictive error filter as illustrated in FIG. 6.

In FIG. 3, each component of the reference signal is considered as a delay or an amplification or an attenuation factor in the composition of the reference signal. Subsequently, the basic delay inherent in the path from the reference loudspeaker 15 to the microphone 14, which is referred to as "Delay1" or ("bulk delay"), can be considered within the undersampled signal processing range to increase the effective length of the adaptive filter. In doing so, an attempt is made to move the long delays into the undersampled range as much as possible to reduce memory consumption and to equalize only the differences in delay at the full sampling frequency using delay lines.

At the same time, existing symmetries can be utilized—for example, if the paths of the two front (FL, FR) and the two rear (RL, RR) loudspeakers are identical. In such cases, first the symmetrical signals may be added together and then the composite reference signal is adapted to the corresponding second adaptive signal in terms of delay time and amplitude. The effective length of the adaptive filter is increased by including the bulk delay in the calculation since the adaptive filter would otherwise equalize the acoustic signal delay time associated with the loudspeaker nearest to the microphone (e.g., the loudspeaker 15 in FIG. 2). This intrinsic, acoustic signal delay time can also be used advantageously to determine the delayed coefficients. Using this technique, the delay line on the microphone signal path can be omitted under certain circumstances. Nonetheless, this enhancement does not yield the most desirable system. To do so, all input signals must be separately considered, resulting in the system illustrated in FIGS. 4A and 4B.

Figures 4A, 4B:
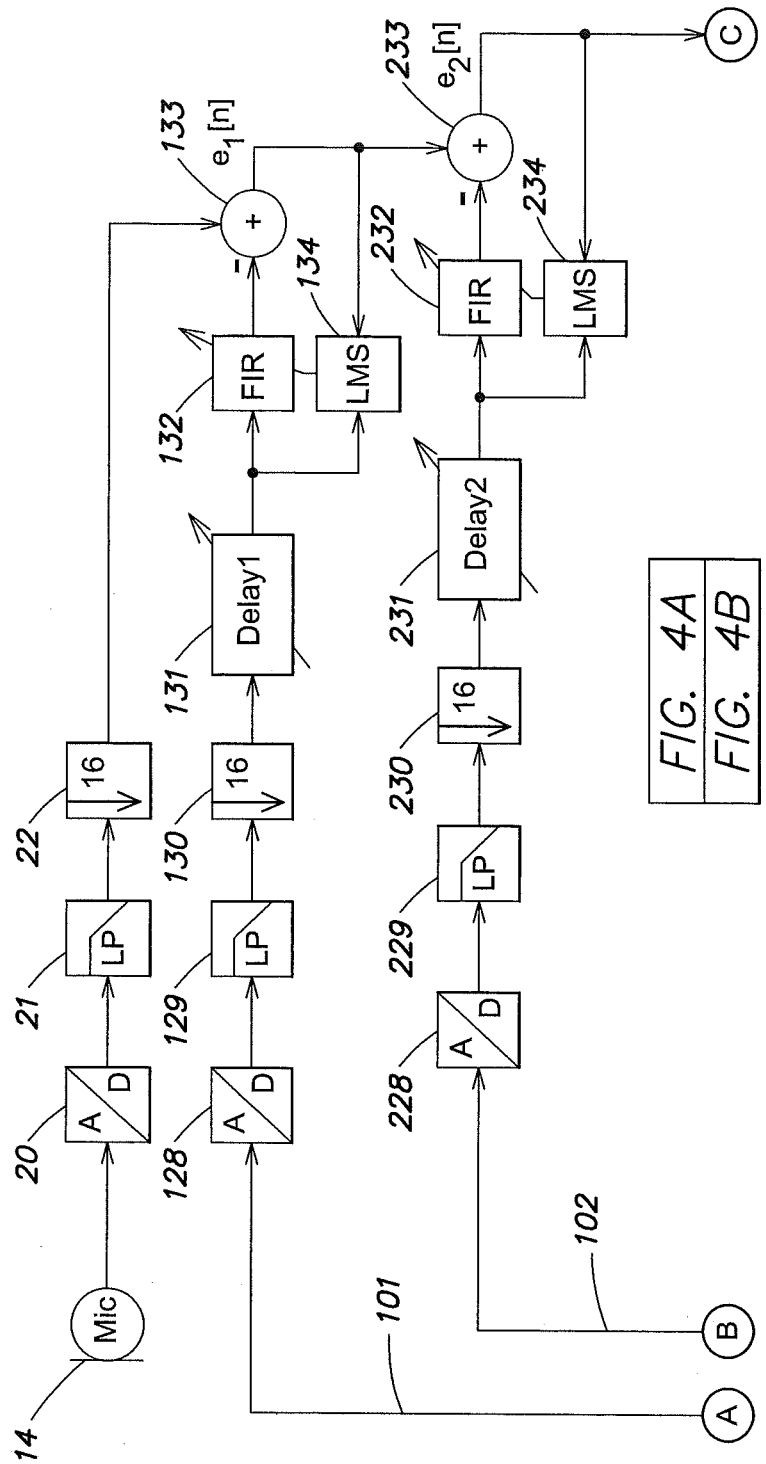
FIGS. 4A and 4B are collectively a block diagram illustration of a DVC system that includes the room transfer functions.
Figure 4B:
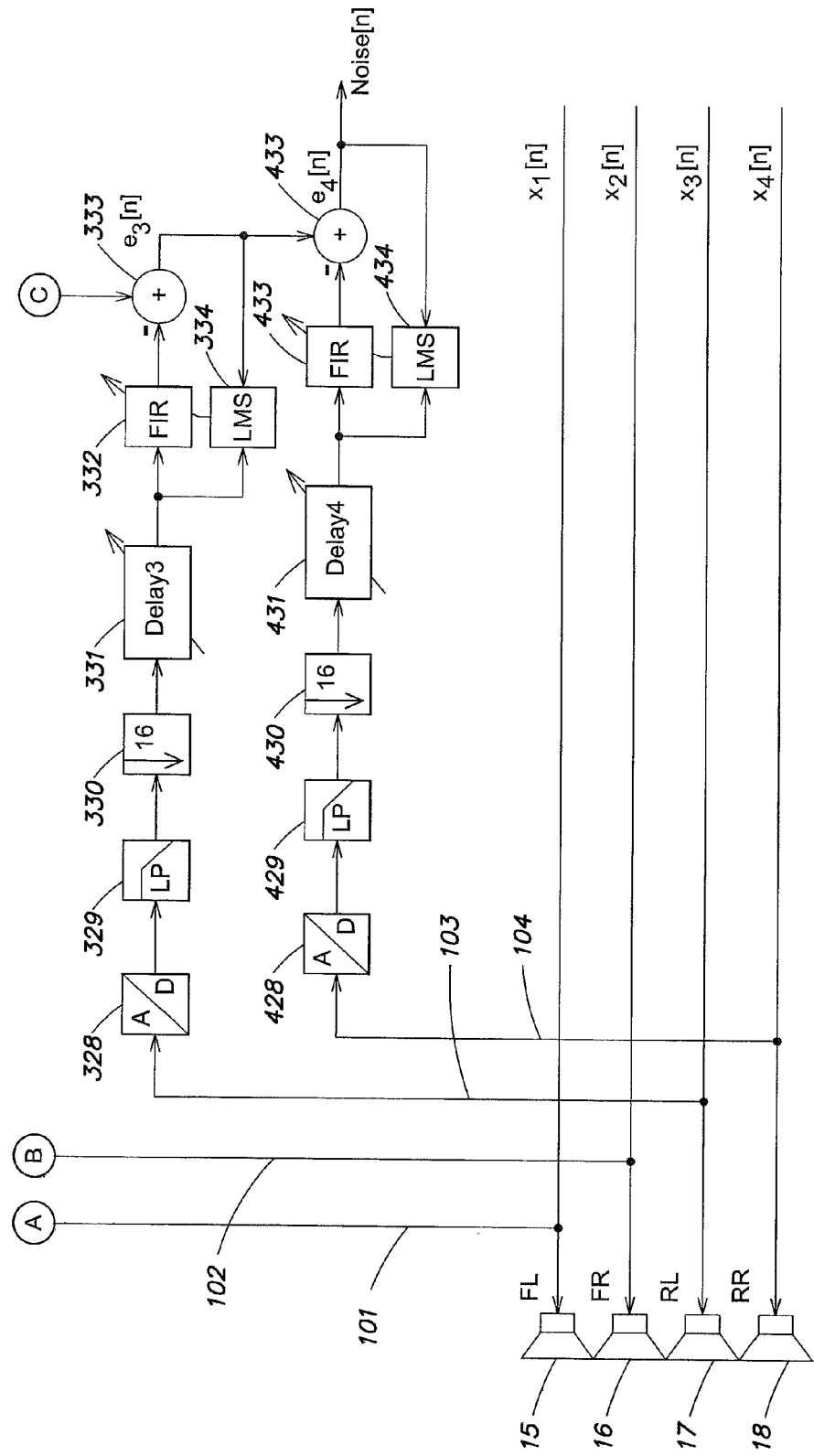

A schematic diagram of a DVC system that includes all room transfer functions is collectively illustrated in FIGS. 4A and 4B. As in FIG. 3, the system of FIGS. 4A and 4B includes a signal path (e.g., a microphone path) established by the microphone 14, the AD converter 20, the low-pass filter 21, and the sample rate conversion unit 22. Further, the signal path of FIG. 3 established by the AD converter 54, the low-pass filter 55, the sample rate conversion unit 56, the delay unit 31, the FIR filter core 32, the filter control unit 34, and the subtraction unit 33 is shown in FIG. 4A by a path (reference path 101) comprising an AD converter 128, a low-pass filter 129, a sample rate conversion unit 130, a delay unit 131, an FIR filter core 132, a filter control unit 134, and a subtraction unit 133. The AD converter 128 receives the reference signal $x_1[n]$ (instead of reference signal $x[n]$ of FIG. 3), and the subtraction unit 133 provides an error signal $e_1[n]$ from the processed microphone signal and the processed reference signal $x_1[n]$.

In contrast to the system of FIG. 3, the system of FIGS. 4A and 4B includes three additional reference paths (paths 102, 103, and 104) established each by AD converters 228, 328, 428; low pass filters 229, 329, 429; sample rate conversion units 230, 330, 430; delay units 231, 331, 431; FIR filter cores 232, 332, 432; filter control units 234, 334, 434; and subtraction units 233, 333, 433. Each of the AD converters 228, 328, 428 receives the respective reference signal $x_2[n]$, $x_3[n]$, $x_4[n]$, and the subtraction units 233, 333, 433 provide error signals $e_2[n]$, $e_3[n]$, and $e_4[n]$ from the error signals $e_1[n]$, $e_2[n]$, and $e_3[n]$ and the processed reference signals $x_2[n]$, $x_3[n]$, and $x_4[n]$, respectively. The reference paths 101, 102, 103, and 104 are identical at least in structure.

The reason the individual room transfer functions are used as illustrated in the system in FIGS. 4A and 4B (i.e., with linking of the individual adaptive filters and not in the conventional, parallel fashion) is explained by the relatively strong correlation of the input signals. The individual room transfer functions may be estimated in parallel independently of each other if the interrelations of the input signals $x_1[n], \ldots, x_4[n]$ are non-correlated.

However, since there is a relatively strong correlation between the input signals, the system functions as follows: the first adaptive filter (in reference path 1), which is fed with the first undersampled reference signal, $(x_1[n])$, through the delay line 131 ("Delay1"), removes all signal components from the microphone signal that are correlated with the reference signal, $x_1[n]$. Ideally, the error or output signal, $e_1[n]$, of the first adaptive filter only contains signal components no longer correlated with the reference signal, $x_1[n]$. The second adaptive filter (in reference path 2) can adapt only if there are components in the error signal of the first adaptive filter, $e_1[n]$, that are correlated with the second reference signal, $x_2[n]$. Otherwise, the second adaptive filter transfers the signal that is also not correlated with the reference signal, $x_2[n]$, as its output signal, and so forth. At the end of the chain, a signal is correspondingly output that is correlated with none of the four reference signals, $x_1[n]$, $x_2[n]$, $x_3[n]$, $x_4[n]$. All that remains is a signal mixture comprising the speech signal and background noise, represented in FIG. 4B as "Noise[n]".

Normally when using music as a reference signal source, a relatively strong correlation can be noted between the individual reference signals $x_1[n], \ldots, x_4[n]$. For this reason, relatively little signal remains after the first adaptive filter for which it may be worthwhile analyzing the remaining reference signals for correlations using adaptive filters. Therefore, perhaps the entire effort may not be worthwhile in practical terms. In terms of signal theory, the system of FIGS. 4A and 4B is valid. However, when viewed economically, the system of FIG. 3 is perhaps more likely to be adopted. Also conceivable is a mixture of the two systems of FIG. 3 and FIGS. 4A and 4B, which may represent a viable compromise.

Figure 5:
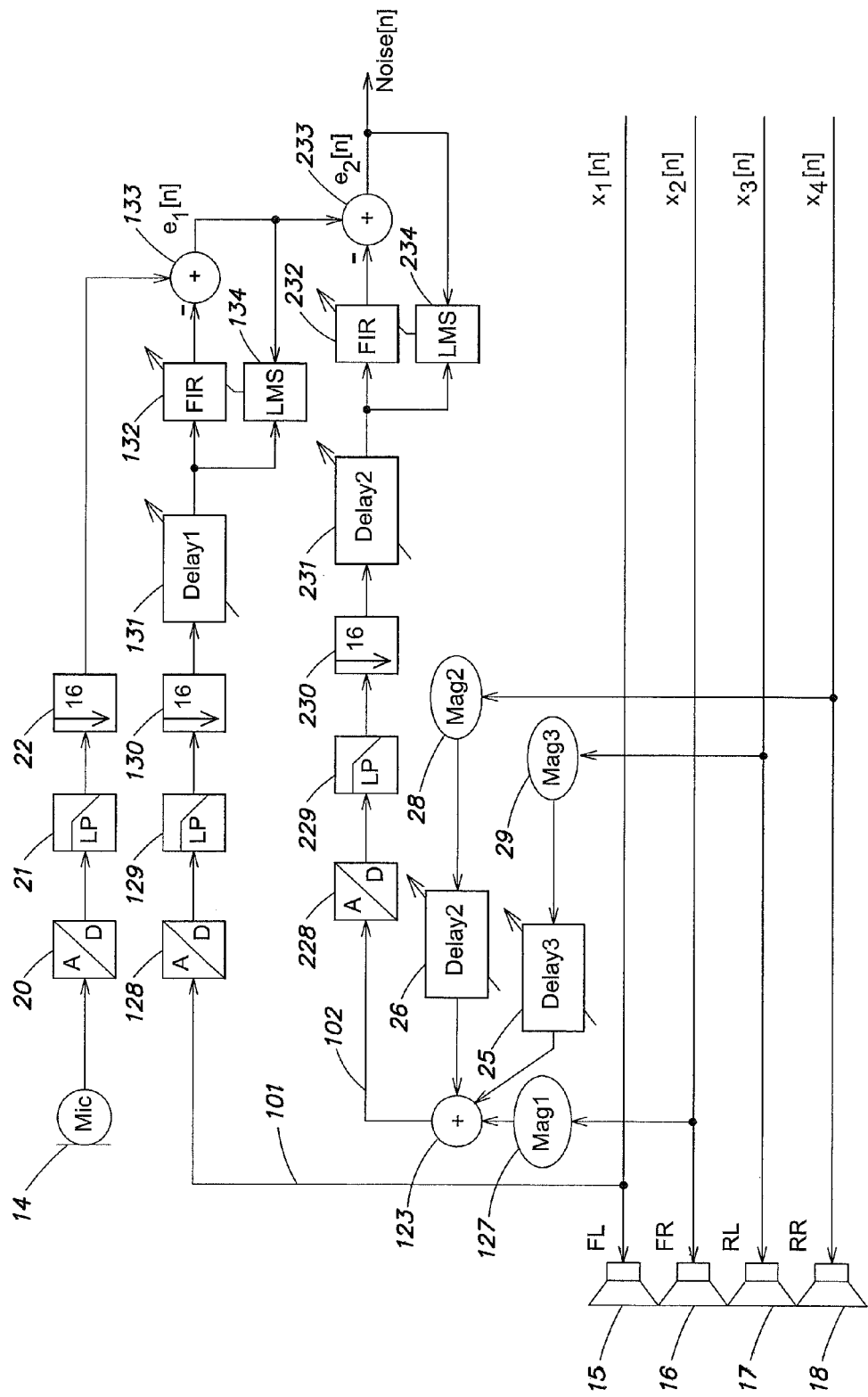
FIG. 5 is a block diagram illustration of a mixture of the two systems illustrated in FIGS. 3 and 4.

FIG. 5 illustrates such a mixture of the two systems of FIG. 3 and FIGS. 4A and 4B. The system of FIG. 5 has a microphone path and the reference paths 101, 102 as illustrated in FIG. 4A. However, path 102 (i.e., AD converter 228) is not supplied with the reference signal $x_2[n]$ as in FIGS. 4A and 4B, but is instead supplied with a mean reference signal similar to that of FIG. 3. In the system of FIG. 5, the mean reference signal is provided by an adder unit 123 receiving the processed reference signals $x_2[n]$, $x_3[n]$, $x_4[n]$. The processing is such that the reference signal $x_2[n]$ is provided to the adder unit 123 via an attenuation unit 127, while the reference signals $x_3[n]$, $x_4[n]$ are provided via the attenuation units 28, 29 and the delay units 25, 26, respectively. The additive error signal "Noise[n]" is output by the subtraction unit 233.

One of the known DVC alternative models has, at least optionally, a high-pass filter arranged after the adaptive filter. The function of the high-pass filter is to smooth the noise spectrum, which is known to have very low frequencies in vehicles, to such an extent that the DVC system can respond not only to the predominant engine and movement noises but also to high-frequency wind noise, which has much weaker signal levels. Even though wind noise has considerably weaker levels than those of the low-frequency components, such noise is found in a spectral region in which human hearing is particularly sensitive, and therefore even a low noise signal level requires a control mechanism.

Until now, a high-pass filter has been used to smooth the noise spectrum as much as possible so that the system can respond practically equally well to both low-frequency noise and the high-frequency wind noise signals just described. The high-pass filter has been set to a fixed value and then left unchanged. This setting is typically adequate for the majority of cases, as demonstrated in many tests. However, there are certain noise situations in which the high-pass filter may act poorly; that is, the filter does not appreciably smooth the spectrum of the noise signal, with the effect that there are different responses to noise signals with differing spectral distribution.

To overcome this, the spectral smoothing filter may be set adaptively in response to the currently applicable noise situation, where linear predictive coding (LPC) analysis is utilized by feeding a predictor error filter (also known as a pre-whitening filter) with the iteratively calculated reflection coefficient. The system is also able to configure the equalizing filter according to the pertaining noise situation in such a way that the output signal of the predictor error filter is distributed across the spectrum as white noise as much as possible.

FIG. 6 illustrates the use of a whitening filter in place of a simple high-pass filter for spectral smoothing of a noise signal, where one reference path (reference path 101 of FIG. 5) is used for explanation purposes in FIG. 6. However, the use of a whitening filter can easily be adapted for the other reference paths. In the system of FIG. 6, high-pass filters 35 and 135 are included in the microphone path and the reference path (reference path 101), respectively, after the corresponding sample rate conversion units. Further, the error signal e[n] provided by the subtraction unit 133 is fed into a predictive error filter 36 controlled by a linear predictive coding (LPC) unit 37 that also receives the error signal e[n]. An effective technique of doing this in the time range is to compute the LPC coefficients using LPC analysis, and to input the coefficients into a predictor filter with which the error signal is weighted.

It is known from other applications such as for example, acoustic echo cancellation (AEC), that echo coefficients are calculated from the voice signal in those cases using LPC analysis, and that the coefficients are then fed into a predictor error filter for filtering the microphone signal. The voice signal recorded by the sensing microphone is spectrally smoothed so that the AEC system can work more efficiently. The AEC application therefore refers to a pre-whitening filter whose effects can be described as follows: the LPC analysis supplies coefficients that are used in a corresponding predictor filter that calls a transfer function corresponding to the power spectral density (PSD) of the signal (i.e., voice signal) examined by the analysis. When used in a predictor error filter, its transfer function does not follow the PSD of the analysis signal, but rather its inverse pattern. For this reason, the voice component in the microphone signal on which the LPC analysis is based is spectrally smoothed after the predictor error filter, that is, it is whitened (thus giving rise to the term "pre-whitening filter").

The linear predictive coding is a relatively efficient and effective technique, for example, to achieve synthetic speech and speech signal communication. The efficiency of the method is due to the speed of the analysis algorithm and to the relatively low bandwidth required for the encoded signals. The effectiveness is related to the intelligibility of the decoded vocal signal. LPC implements a type of vocoder which is an analysis/synthesis scheme where the spectrum of a source signal is weighted by the spectral components of the target signal that is being analyzed. The phase vocoder is, for example, a particular type of vocoder where amplitude and phase information of the analysis channels is retained and can be used as coefficients for an error filter.

In standard LPC, the source signals are either white noise or a pulse train, thus resembling voiced or unvoiced excitations of the vocal tract, respectively. The basic assumption behind LPC is the correlation between the n-th sample and the p previous samples of the target signal. Namely, the n-th signal sample is represented as a linear combination of the previous P samples, plus a residual representing the prediction error. The analysis problem is equivalent to the identification of the coefficients, a, of an all-pole filter. When reducing the error in a mean square sense, the problem translates into a set of P equations which, in the z domain (frequency domain), reduce to $E(z)=A(z)X(z)$, where $A(z)$ is the polynomial with coefficients a and $E(z)$ is the prediction error. In the case of voice signal analysis, the filter $1/A(z)$ is called the all-pole formant filter because, if the proper order p is chosen, its magnitude frequency response follows the envelope of the signal spectrum, with its broad resonances called formants. The filter $A(z)$ is called the inverse formant filter because it extracts from the voice signal a residual resembling the vocal tract excitation. $A(z)$ is also called a whitening filter because it produces a residual having a flat spectrum.

However, there are two kinds of residuals, both having a flat spectrum: the pulse train and the white noise, the first being the idealized vocal-fold excitation for voiced speech, the second being the idealized excitation for unvoiced speech. In reality, the residual is neither one of the two idealized excitations. At the re-synthesis stage the choice is either to use an encoded residual or to choose one of the two idealized excitations according to a voiced/unvoiced decision made by the analysis stage.

When the target signal is periodic (voiced speech), a pitch detector can be added to the analysis stage, so that the re-synthesis can be driven by periodic replicas of a basic pulse, with the correct inter-pulse period. Several techniques are available for pitch detection, either using the residual or the target signal. Although not particularly efficient, one possibility is to perform a Fourier analysis of the residual and estimate the fundamental frequency by the techniques of section. For example, the information extracted by the analysis stage are the prediction coefficients $a_1, \ldots, a_p$; the residual e; the pitch of the excitation residual; the voiced/unvoiced information; and the signal energy (RMS amplitude). These parameters, possibly modified, are used in the re-synthesis stage, for example, by use of the well-known Levinson-Durbin recursion, which provides the reflection coefficients of the lattice realization of the filter $1/A(z)$.

An effective technique of doing this is to compute the LPC coefficients using LPC analysis, and to input the coefficients into a predictor filter with which the music signal is weighted. Known DVC systems typically use a simple voice activity detection (VAD) function that makes use of the long-term steady state of the background noise signal and the short-term steady state of the human voice with the aid of two mean value calculation units. This VAD variant is nonetheless relatively difficult to control, and for this reason a new VAD model that is easier to control and also even simpler to implement is preferred.

Figure 7:
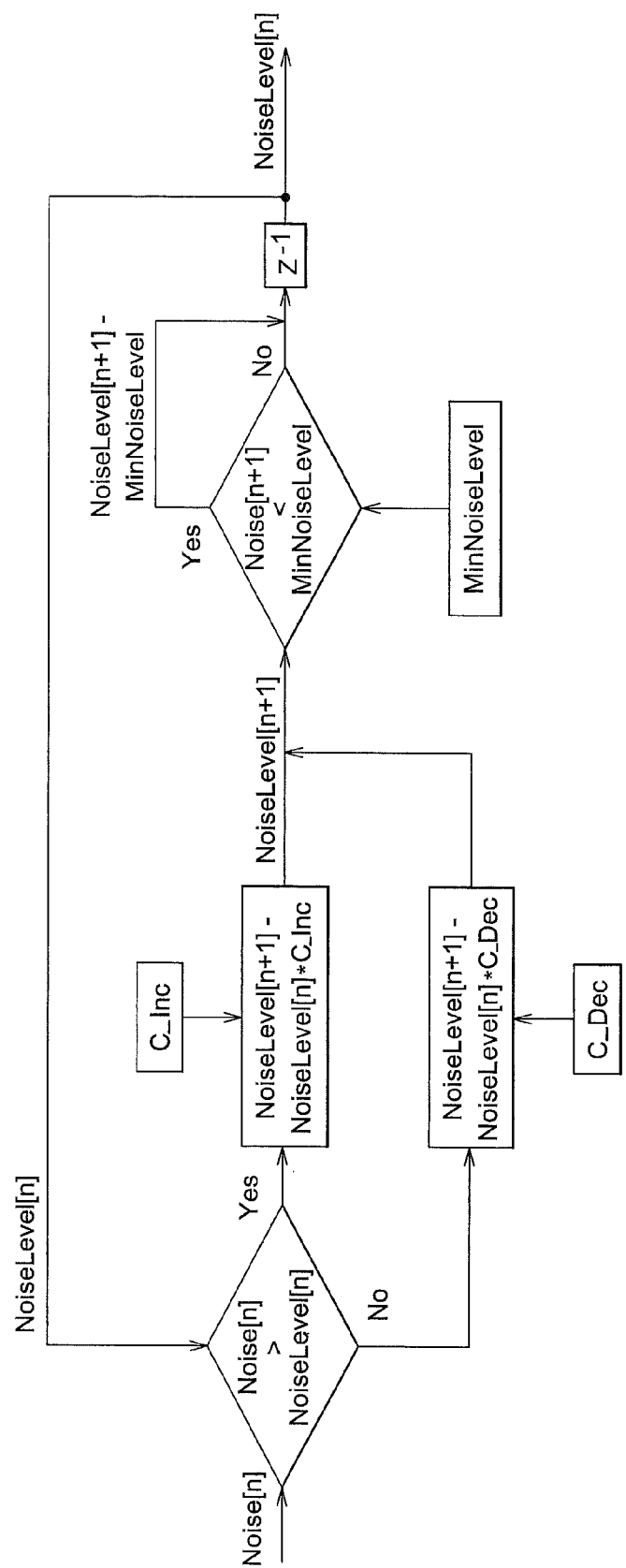
FIG. 7 is a flowchart diagram of a voice activity detection model.

FIG. 7 illustrates the signal flow diagram for a VAD model. The VAD model examines whether the current noise value (Noise[n]) is greater than the previous noise level (NoiseLevel[n]). If this is the case, the new noise level (NoiseLevel[n+1]) is calculated from the previous noise level such that the new noise level increases by a predetermined increment, regardless of how much the current noise signal value is greater than the previous noise level.

This approach suppresses relatively strong effects of the voice signal components within the noise signal on the noise level, and even without any delay since the VAD model according to an aspect of the invention has no memory function, unlike known models. If the current noise signal is less than the previous noise level, the new noise level value is reduced by a predetermined decrement. The increment is generally defined to be less than the decrement so that there is no agitated response to brief energy spikes in the noise signal.

The noise level is restricted to a low limit value using the low threshold value of the noise level "MinNoiseLevel". The noise level is prevented from falling below a specific level in this way. Without a low threshold value of this kind, the system would at times respond slowly to a rising noise signal because the rising speed (which is governed by the increment) is slower than the falling speed.

The DVC systems previously described are operated with one microphone. As such, the noise situation is recorded at the mounting point of the microphone. This information is then used to develop a global controlled variable for the entire vehicle. However, a number of aspects are not considered, which can lead to errors. For example, if the microphone is positioned where standing waves are located in the interior of the vehicle, the system can respond inadequately or not at all to noise signals at exactly the same frequencies. Ideally, the microphones are positioned at the position of the passenger's head, because this noise situation at every position affects the passenger's auditory perception, which is intended to be enhanced using DVC and DEC systems.

Thus, the microphone is integrated in the headrest, for example, to ensure the microphone is positioned as close as possible to the best point of auditory perception. The same challenge applies to all other passengers in the vehicle. Even if a microphone is placed in the ideal position for the driver, this does not automatically mean that this arrangement produces good results at the remaining positions in the interior of the vehicle. Each listening position requires its own microphone for the system to provide equally good results. However, it is relatively complicated to obtain an effective control system as each loudspeaker would have to provide a contribution for each microphone position to acquire the desired control effect at the same time at every listening point.

Figure 8:
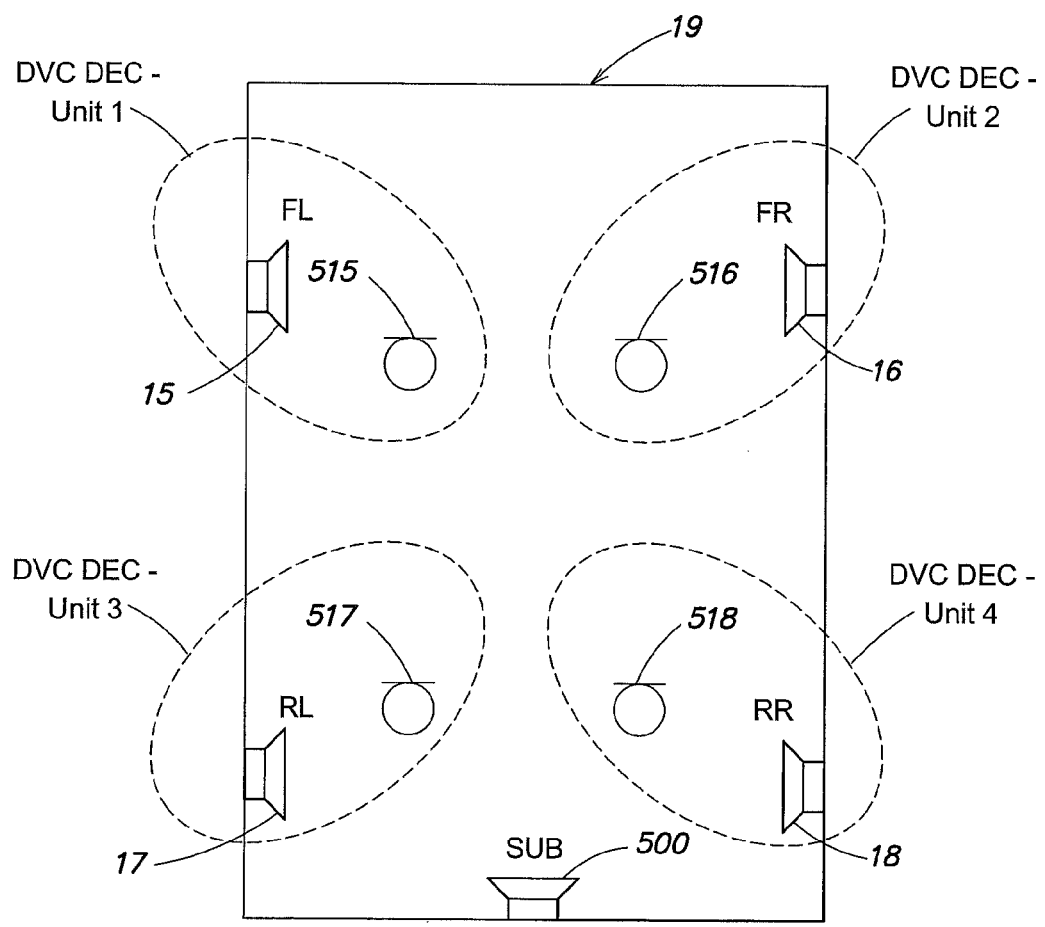
FIG. 8 is a block diagram illustration of an arrangement of a multi-channel DVC/DEC system.

FIG. 8 illustrates an example of an arrangement of a multi-channel DVC/DEC system in a room 19. The relatively simple technique for obtaining an individually adapted control system is to deploy the loudspeakers 15-18 located nearest the associated microphones 515-518 for control of the amplitude through the DVC system and control of the equalization through the DEC system. As such, only the spectral range of a subwoofer 500 is then controlled globally. This is however readily acceptable as the range cannot generally be localized, and the human ear is relatively insensitive in this frequency range to variations in signal level.

The method using LPC analysis, which can be efficiently implemented, for example, using the gradient adaptive lattice (GAL) algorithm, is in principle an effective technique of implementing dynamic equalization with adaptation to the power density of the noise signal. In principle, any voice signal components present in the noise signal can for the most part be excluded using a relatively slow update speed for the GAL algorithm. However, some problems remain which are illustrated herein together with their associated solution.

If the LPC analysis is applied to the noise signal isolated by the adaptive filter using the GAL algorithm with a correspondingly slow update speed, the reflection coefficients deriving from the analysis are set in such a way that when included in a predictor filter (all-pole filter), the transfer function of the filter more or less exactly matches the characteristics of the noise signal's power spectrum density (PSD), depending on the predictor order selected. The LPC analysis returns reflection coefficients whose values are based exclusively on the PSD development of the analyzed noise signal, but that do not provide any information on the signal's amplitude relationships. Furthermore, the amplitude of the predictor filter is relatively high to be ever directly used.

To solve these problems, the transfer function of the predictor filter is continually scaled such that its maximum value is as close to 0 dB as possible. From the known scaling standards, i.e., the L1, L2 and L∞ standards, the L1 standard is utilized since it is relatively easy to calculate and also represents the relatively hard scaling type.

$$\text{Scale} = \sum_{n=0}^{\infty} |f[n]| \quad (4)$$

Equation 4 is a formula for calculating the scaling factor according to the L1 standard. As can be seen from equation 4, an infinite number of values of the filter's impulse response is required in theory to calculate the scaling factor exactly according to the L1 standard, which is however impossible in practical terms. In view of this, restriction is made to the assumption of a limited impulse response, which is then used to calculate the scaling factor ("scale") according to the L1 standard. The length of the impulse response is defined on the basis of both the error that is made when calculating the scaling factor and of the update time with which is desired or needed to generate a scaling factor applicable to the next impulse response interval. To keep the update interval as short as possible, it is advisable to perform the calculation (at least for the impulse response) using the original sampling frequency $f_s$ and not with the reduced sampling frequency $f_s/R$.

Once it has been ensured that the predictor filter's maximum value is 0 dB (i.e., it is scaled to 0 dB), it is still to decide to what extent the equalizing or predictor filter is permitted to influence the required useful signal. This decision is mainly dependent on the current noise level that has already been determined using the DVC system. This implies that it is practical to couple the DEC and DVC systems together. Nevertheless, a determination is to be made as to the control of the equalizing filter on the basis of the existing noise level or in what structure it can be applied.

Figure 9:
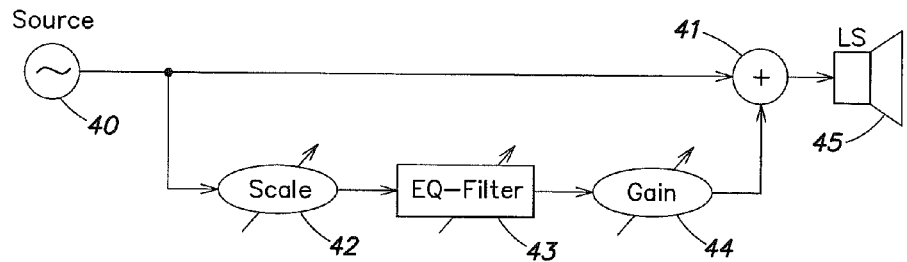
FIG. 9 is a block diagram illustration of the structure of an equalizing filter.

FIG. 9 illustrates the structure of an equalizing filter. Peaking filters may be used for the implementation of the equalizing (EQ) filter. In peaking filters, a gain control can be used to set how far the implemented EQ filter is to extend beyond the reference amplitude, which is also normally at 0 dB. This structure is chosen for the EQ filter, that is, the gain from the DVC system indicates how much the maximum spectral share of the EQ filter scaled (by "Scale") to 0 dB is to be higher than the reference amplitude. In this way, only the spectral components that are particularly strongly concealed by background noise are amplified along with the DVC gain. This has the same effect as dynamic equalizing, that is, a DEC system. The gain derived from the DVC system does not have to be accepted on a 1-to-1 basis, rather it can be scaled at will for the DEC system or changed in any other way to obtain a satisfactory control effect. The filter illustrated in FIG. 9 comprises a source 40 connected to a subsequent adder unit 41 as well as a scaling unit 42. An equalizing (EQ) filter 43 and a subsequent gain adjusting unit 44 are connected downstream from the scaling unit 42. The output signal provided by the gain adjusting unit 44 is fed into the adder unit 41, whose output signal is provided (via units not shown) to a loudspeaker 45.

Figure 10:
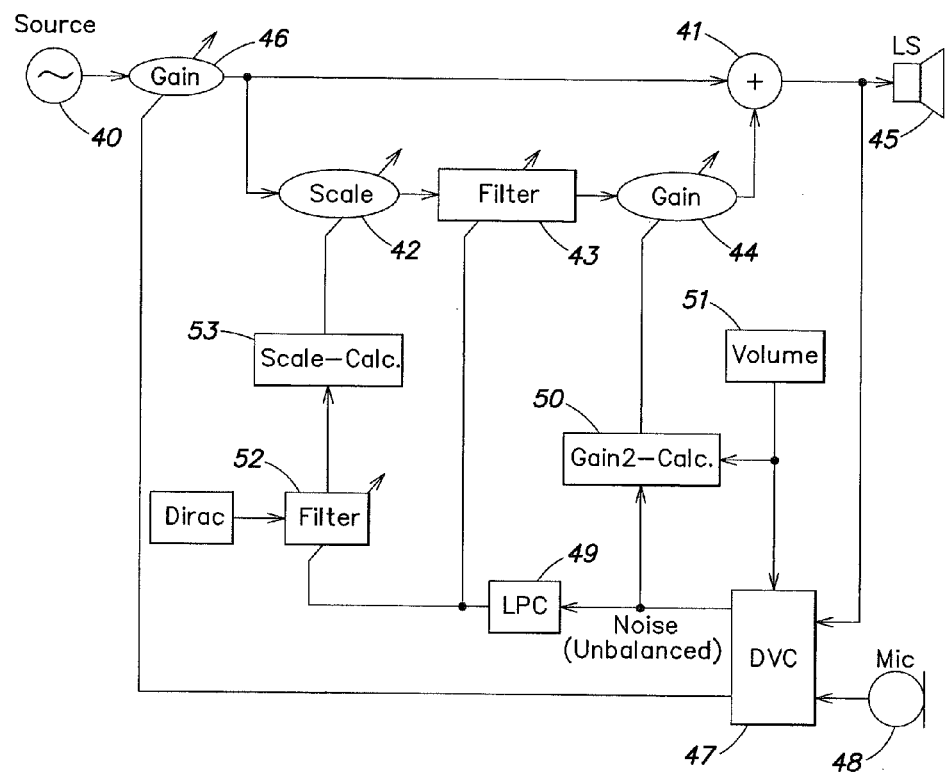
FIG. 10 is a block diagram illustration of an exemplary DVC/DEC system.

FIG. 10 is an example of a relatively simple DVC/DEC system. In addition, the new gain value can be calculated together with the previously determined scaling factor to produce a further version of the DVC/DEC system. The filter of FIG. 9 is applied to system of FIG. 10 such that the filter is not connected directly to the source but through a gain adjusting unit 46 controlled by a DVC unit 47. The DVC unit 47 is supplied with signals from the loudspeaker 45 and a microphone 48 and further controls an LPC unit 49 and a gain calculation unit 50. The DVC unit 47 and the gain calculation unit 50 are further controlled by a volume control 51. The EQ filter 43 is controlled by the LPC unit 49 which also controls, via a Dirac pulsed filter 52 and a scaling calculation unit 53, the scaling unit 42, where the gain adjusting unit 44 is controlled by the gain calculation unit 50.

Figure 11:
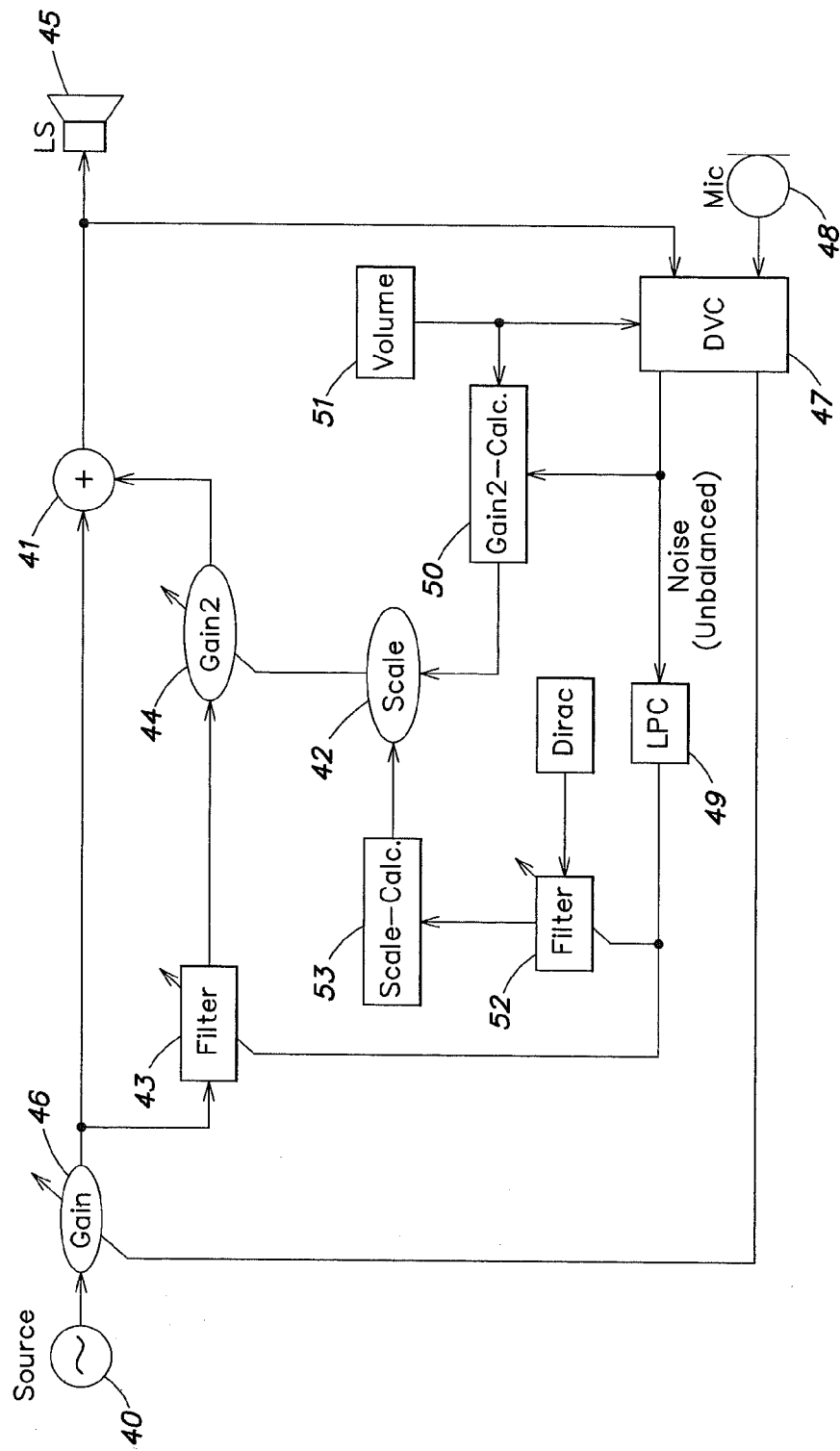
FIG. 11 is a block diagram illustration of an exemplary DVC/DEC alternative system.

FIG. 11 illustrates another DVC/DEC system. The system of FIG. 11 differs from the system of FIG. 10 in that in the system of FIG. 11 the scaling unit 42 is not connected between the gain adjusting unit 46 and the EQ filter 43 (as in FIG. 10), but between the output of the gain calculation unit 50 and the control input of the gain adjusting unit 44.

Figure 12A:
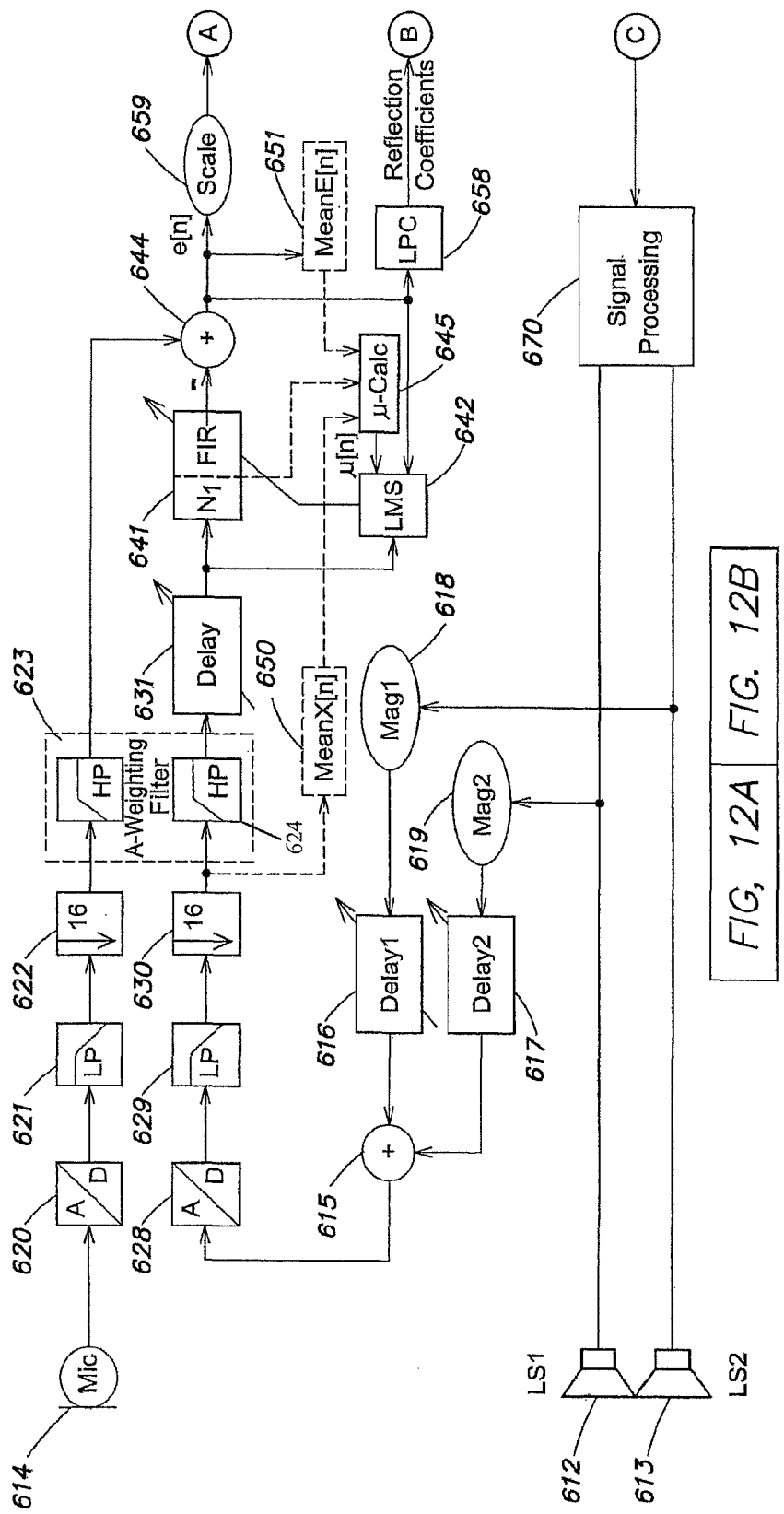
FIGS. 12A and 12B are collectively a block diagram illustration of a complex exemplary DVC/DEC system.
Figure 12B:
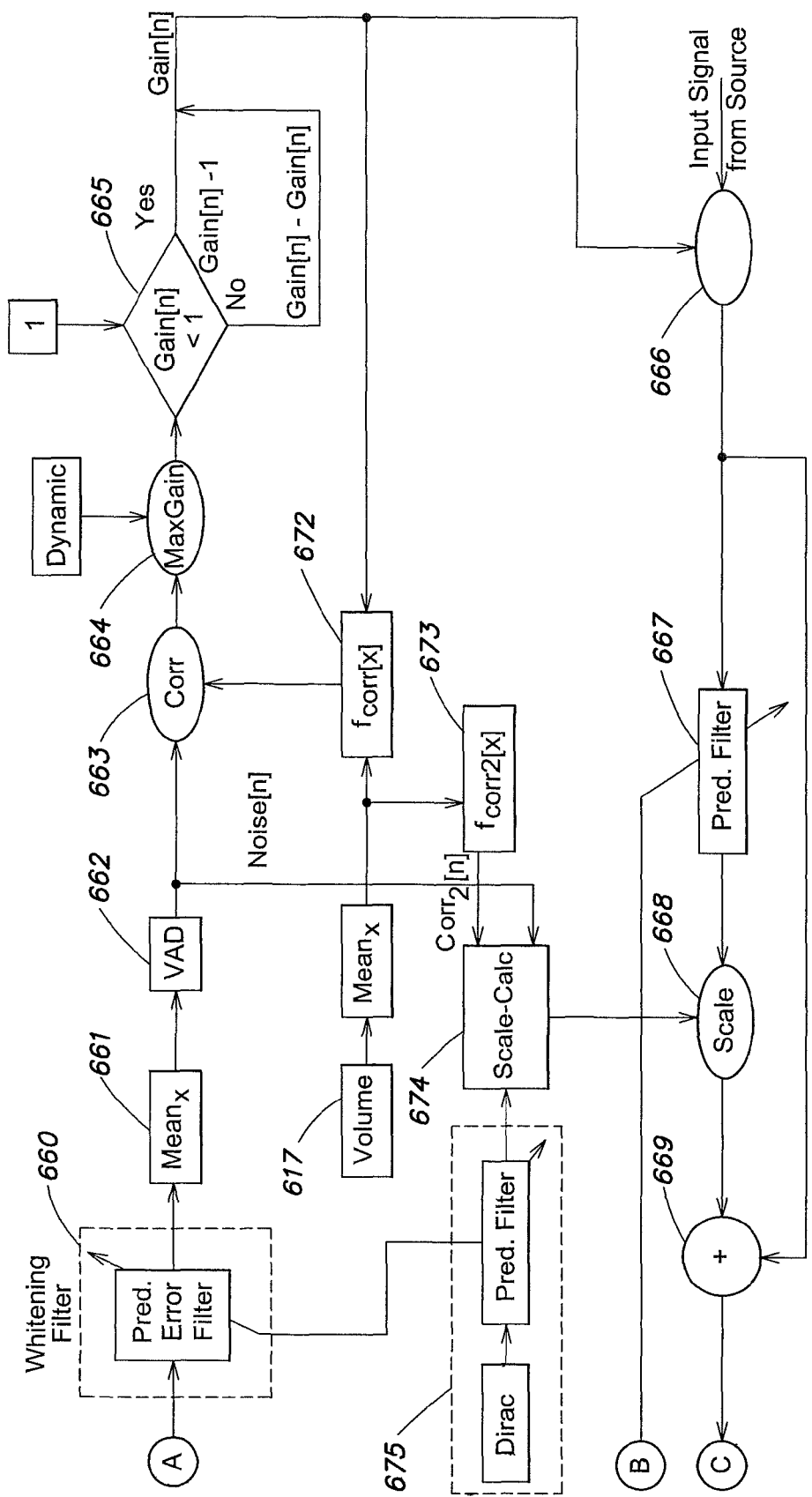

FIGS. 12A and 12B collectively illustrate an example of a relatively complex DVC/DEC system. The system of FIGS. 12A and 12B has a microphone path and a reference path. The microphone path is established by a microphone 614, an AD converter 620, a low-pass filter 621, a sample rate conversion unit 622, and an A-weighting high-pass filter 623. The reference path is established by an AD converter 628, a low-pass filter 629, a sample rate conversion unit 630, an A-weighting high-pass filter 624, and a delay unit 631. The AD converter 628 receives a reference signal from an adder unit 615 connected to two delay units 616, 617. The delay units 616, 617 are each supplied with a signal provided to two loudspeakers 612, 613 via corresponding amplifying units 618, 619, respectively.

The reference path further comprises an adaptive filter having a finite impulse response (FIR) filter core 641 controllable by a Least Mean Square (LMS) adaptation unit 642. The LMS unit 642 receives an input signal from the delay unit 631, an error signal e[n] from a subtraction unit 644, and an adaptation step size μ[n] from a step size calculation unit 645. The step size calculation unit 645 is supplied with: (i) a mean source signal Mean X[n] tapped from the sample rate conversion unit 630 via an average unit 650, (ii) an estimated system distance Dist[n] supplied by the FIR filter core 641, and (iii) a mean error signal Mean E[n] tapped from the subtraction unit 644 via an average unit 651. The subtraction unit 644 further receives via the microphone path a signal from the microphone 614 which is part of a loudspeaker-room-microphone (LRM) system (not shown in FIGS. 12A and 12B). The LRM system further comprises a room having a transfer function $H_{Room}(Z)$, and the two loudspeakers 612, 613.

The error signal e[n] is supplied via a scaling unit 659 to a prediction error filter core 660 serving as a whitening filter. Downstream of the filter core 660 is an averaging unit 661, a voice activity detector 662, a gain correction unit 663, a maximum gain unit 664, and a compare unit 665 evaluating whether the gain is below 1. If the gain is below 1, the gain of an amplifying unit 666 is set to 1, otherwise the gain is left unchanged. The amplifying unit 666 is supplied with an electrical sound signal from a sound source (e.g., CD player, cassette player, radio and the like) and feeds the amplified sound signal into a prediction filter core 667 controlled by a linear predictive coding unit 658 supplied with the error signal e[n]. Downstream of the filter core 667 is a scaling unit 668 and an adder unit 669 which also receives the signal from the amplifying unit 666 input into the filter core 667. The output signal of the adder unit 669 is processed by a sound signal processing unit 670 in a common way and supplied to loudspeakers 612 and 613.

The gain settings from the compare unit 665 as well as mean volume settings 671 by the listener are used to set a gain control unit 672 for controlling the gain correction unit 663. The mean volume settings 671 are further used to control a gain control unit 673 for controlling a scaling unit 674. The scaling unit 674, which controls the scaling unit 668, further receives signals from a Dirac pulsed prediction filter 675 and the VAD 662. The Dirac pulsed prediction filter 675 controls the prediction error filter 660 by copying its filter coefficients into the prediction error filter 660.

Fundamentally, the reference signal is tapped as much as possible at the end of the signal processing chain to prevent negative effects of the equalizing and dynamic modifications (limiters, compressors, et cetera) on the performance of the adaptive filter. Moreover, it has been assumed that it would be advantageous to obtain the reference signal by adding all relevant signal paths. However, in practice, not only is the phase of the reference signal strongly distorted, but also its amplitude, due to the phase differences between the individual signal paths, some of which are quite significant. This situation necessarily leads to an incorrectly working adaptive filter.

Figure 13:
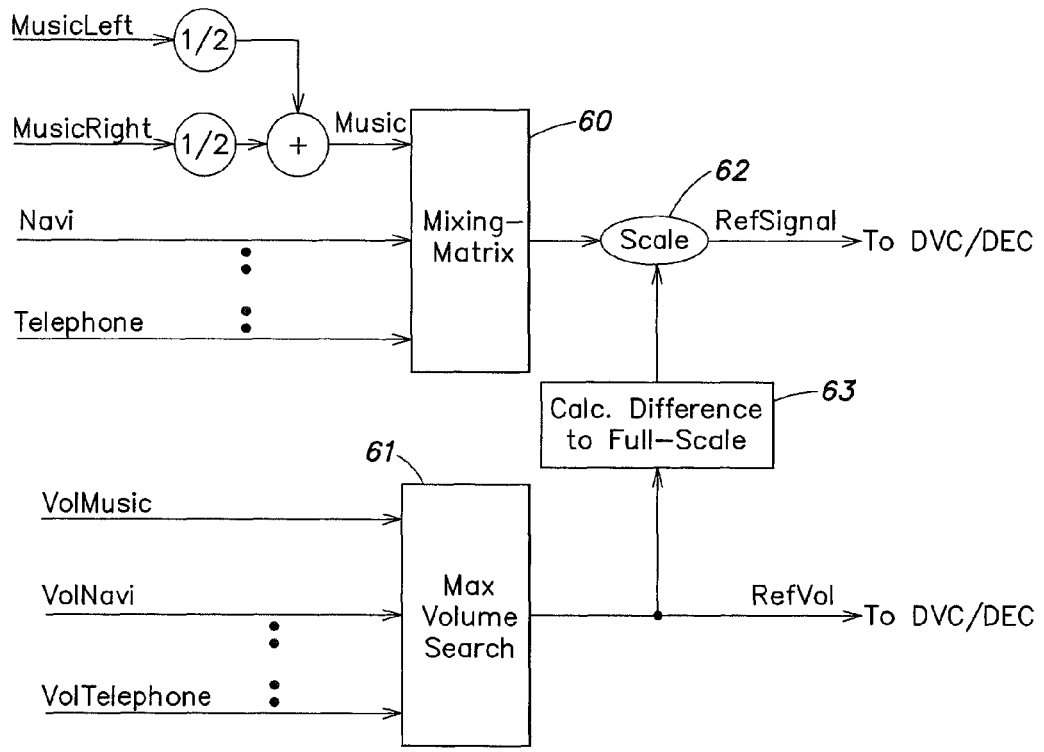
FIG. 13 is a block diagram illustration of the generation of a reference signal and a reference volume.

One way of improving the performance is to use a single, broadband output signal for which no addition is performed. This is also permissible provided all output signals are strongly correlated with each other, which is usually the case with audio signals. Unfortunately, broadband output signals of this nature are rarely found in signal flow diagrams since the output signals are generally adapted to the bandwidths of the connected loudspeakers using crossover filters before they are output, and are consequently limited in bandwidth. A more desirable solution is to use the reference signal generation configuration as illustrated in FIG. 13. This configuration makes use of all correlations when generating the reference signal and dispenses with all signal addition operations.

Yet another technique likewise embodies an alternative method for reference signal generation. In this alternative technique, the reference signal is generated from one or more input signals. Although this technique is in principle undesirable, it has shown itself in practice to be a simple, yet efficient mechanism of reference signal generation. This is true when the entire signal processing between the input and output signals is considered as a stationary system. In this respect, the system is practically part of the LRM system, which can be reproduced by the adaptive filter. In addition to the music, which is normally available in a stereo signal, any available special channel typically serves as a reference, if it is not to act as a potential noise influence. In doing so, different source signals may be mixed together in a particular relationship at the same time. The mixer determines the extent to which one signal mixes with another.

Consequently, the output signal of the mixer, which mixes all source signals together, represents a relatively good input signal for this purpose. The signal amplitude is still a problem though in that it is likewise modified by the mixer. Since the greater the amplitude of the reference signal, the better the adaptive filter works, one technique of obtaining a continuously well-controlled reference signal (mixer output signal) is to scale the reference signal such that it is as fully driven as possible, regardless of the configured volume. To find the scaling factor, the maximum value of the sum of all loudness values (volumes) of the source signals is determined, and its difference to the fully driven signal is calculated, which is the equivalent of the scaling factor. Depending on whether the volume values are linear or logarithmic, the following formulae are used to calculate the scaling factor:

Logarithmic: $Scale_{dB} = 0_{dB} - MaxVol_{dB}$ or

Linear: $Scale_{Lin} = 1/MaxVol_{Lin}$

The calculated maximum volume is then also used as the reference loudness value (VOLUME) in the calculation of the anti-gain chase function in the DVC/DEC system so that problems due to relatively low volumes are avoided from the outset.

FIG. 13 illustrates a model for generating the reference signal and reference volume. In the model illustrated in FIG. 13, a mono signal is generated from the stereo music input signals "MusicLeft" and "MusicRight" before being fed into a mixing matrix 60. This is not absolutely necessary, but it simplifies the mixing matrix 60. The problem associated with impure phase addition normally does not occur, or only to a minor degree, in this system as no signal processing has yet been performed using the two music signals, thereby rendering the risk of reference signal distortion minimal.

Practical experimentation using the DVC system demonstrated that it functions in an acceptable manner within a specific noise level range, but that it begins to respond (at least as subjectively perceived) in an exaggerated manner to noise levels above that range. For this reason, a gain correction (scaling unit 62 in connection with Maximum volume search 61 and Difference-to-full-scale calculation unit 63) function may be integrated to modify the noise level value ("NoiseLevel" in FIG. 15) weighted with the correction factor ("Con") deriving from the anti-gain chase function. The weighted level is referred to as the ratio.

Figure 14:
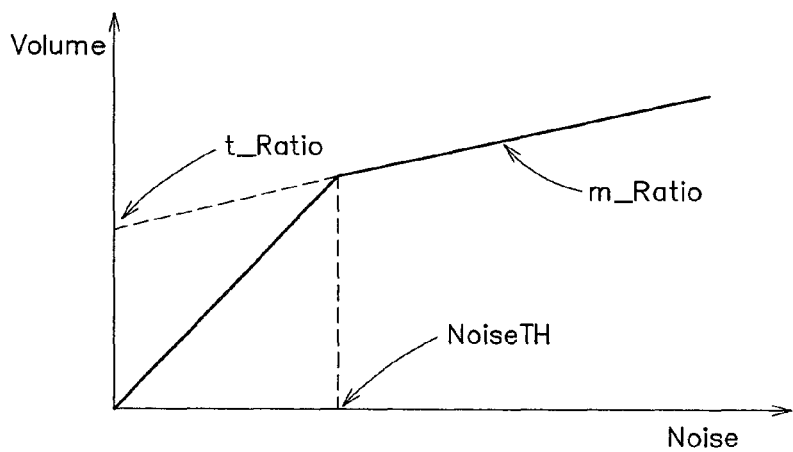
FIG. 14 is a graph that illustrates the characteristics of a gain correction function.
Figure 15:
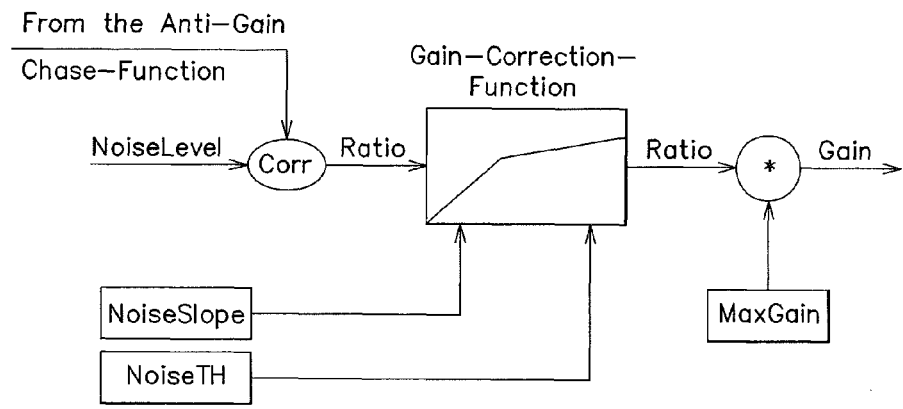
FIG. 15 is block diagram illustration of an exemplary implementation of a gain correction function.

FIG. 14 illustrates the characteristic of the gain correction function. FIG. 15 illustrates the implementation of a gain correction function. The gain correction function is controlled by two parameters, namely noise threshold ("NoiseTH") and NoiseSlope which is the slope of the right-hand line of FIG. 14. NoiseTH is used to control how a measured increase in the background noise level results in a volume increase. Below NoiseTH the ratio is about 1:1 and above NoiseTH the ratio is as NoiseSlope indicates below 1:1. A reason for this may be that, as an outcome of under-sampling, lower frequency components being used basically only for the calculation of the gain factors increase more than higher frequency components do with an increase of the background noise. However, as DVC gain is effective in the entire frequency range and listeners are most sensitive in the mid-range the system as to be adapted by introducing a gain correction function to address the issue outlined above. The gain correction function may be incorrect for lower frequencies but this incorrectness may be overcome by arranging the DVC gain units downstream from a loudness processing unit. Alternatively, the DEC may be adapted to compensate for the incorrectness.

Referring to the speech activity detection function illustrated in FIG. 7, sometimes the period is relatively long until the actual end noise level value is reached so that appropriate countermeasures can be taken. The waiting time is due to the low slew rate ("C_INC") with which the system responds to increasing noise levels. The threshold value, "Min-NoiseLevel", is used to prevent the noise level from falling below a specific level, which in effect is identical to the activation threshold of the system. However, care must be taken to avoid setting the threshold too high as otherwise the control function may be activated although the noise level is not high enough.

Figure 16:
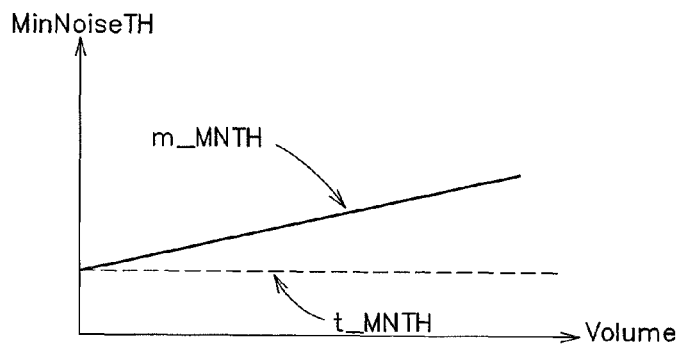
FIG. 16 is a graph that illustrates the characteristics of an activation threshold.

By deploying the anti-gain chase function, the maximum permissible control dynamics ("MaxGain") vary according to the volume. Since the activation threshold ("Min-NoiseLevel") depends on the maximum gain, it must likewise be modified according to the volume. This yields a characteristic for the activation threshold, a straight line whose Y axis section ("t_MNTH") varies with the maximum gain ("MaxGain") and the noise scaling factor ("Scale"), and whose slope ("m_MNTH") is correlated with the slope of the anti-gain chase function ("m_Corr"). FIG. 16 illustrates the characteristics of the activation threshold.

Figure 17:
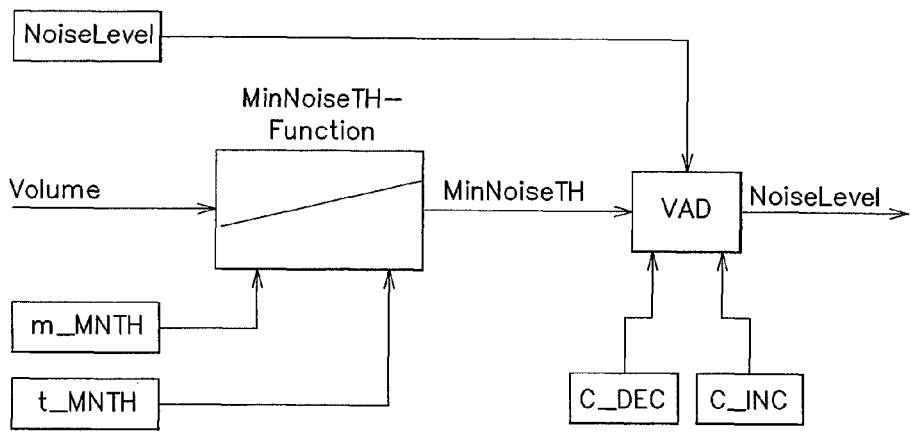
FIG. 17 is a block diagram illustration of an implementation of a minimum noise activation threshold function.

FIG. 17 illustrates an implementation of the MinNoiseTH (activation threshold) function. The use of an adaptation step $\mu[n]$ size has shown itself to be relatively useful in practice. In particular, the negative effects of strong, brief noise signals, for example, the human voice can be reduced to a minimum using the appropriate step size, especially in the case of transmission of loud, bass source signals since these contribute little or nothing in the calculation of the noise level. The energy of the error signal, MeanE[n] (FIG. 1), is scaled according to the amplitude of the reference signal when tuning the adaptation step size (the reference signal is driven as much as possible, as described earlier). The greater the effect of the reference signal in the calculation of the adaptation step size, the more the energy of the error signal must be scaled upwards. The converse applies equally.

If the exemplary implemented model illustrated in FIG. 13 for generating the reference signal is used, the formula of equation 1 is also correct. However, this is not always the case. Care should be taken that no error is made since this may cause problems with the entire adaptive filter, which may have worse consequences for the entire DVC/DEC system. It was also discovered that the adaptation step size, $\mu[n]$, may be limited to a specific range ($\mu[n] \in [0, \ldots, \mu_{Max}[n]]$) so that the adaptive filter can function more reliably. In particular, the maximum permissible adaptation step size $\mu_{Max}[n]$ may not be set to a relatively large value as otherwise there is a risk that the adaptive filter will become unstable and start to oscillate, which may cause the DVC/DEC system to fail. A value of about 0.01 for $\mu_{Max}[n]$ has proven acceptable. This value is not intended to apply in general but may rather serve as a guideline figure. Its precise maximum value must be calculated for each particular case.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Although an example of this invention has been described hereinabove in detail, it is desired to emphasize that this has been for the purpose of illustrating the invention and should not be considered as necessarily limitative of the invention, it being understood that many modifications and variations can be made by those skilled in the art while still practicing the invention claimed herein.

What is claimed is:

1. An audio enhancement system for compensating for ambient noise in a listening environment, comprising:
   a transducer that receives an electrical sound signal and generates a sound output from the electrical sound signal;
   a sensor that obtains a total sound signal representative of the total sound level in the listening environment, where the total sound level comprises the sound output from the transducer and the ambient noise in the listening environment;

a filter that is responsive to the total sound signal and to a reference signal derived from the electrical sound signal, extracts an ambient noise signal representative of the ambient noise in the environment from the total sound signal, and comprises an adaptive filter with an adaptive step size;

a controller that is responsive to the ambient noise signal, and generates a control signal;

an equalizer that is responsive to the control signal, and adjusts the sound output of the transducer to compensate for the ambient noise level; and a step size calculation unit that controls the adaptive step size of the adaptive filter;

where the filter comprises at least one of a total sound signal path that processes the total sound signal with a low-pass filter and a sample rate conversion unit; and a reference signal path that processes the reference signal with a low-pass filter and a sample rate conversion unit.

2. The audio enhancement system of claim 1, where the transducer receives at least three electrical sound signals and generates at least three sound outputs from the electrical sound signals, where a first of the three electrical sound signals comprises the reference signal that is supplied to the filter, and a second and a third of the electrical sound signals are processed to provide a second reference signal.

3. The audio enhancement system of claim 2, where the second and the third of the electrical sound signals are processed in a reference signal calculation arrangement to provide the second reference signal.

4. The audio enhancement system of claim 3, where the reference signal calculation arrangement at least one of attenuates and delays the second and the third of the electrical sound signals, and sums the at least one of attenuated and delayed electrical sound signals.

5. The audio enhancement system of claim 1, further comprising:

an amplifier that amplifies the output signal of the equalizer;

a gain controller that controls the amplifier; and a scaler connected between the gain controller and the amplifier.

6. The audio enhancement system of claim 5, further comprising a scaling controller that controls the scaler.

7. The audio enhancement system of claim 6, wherein the scaling controller comprises a Dirac filter and a scaling calculation unit.

8. The audio enhancement system of claim 5, wherein the gain controller comprises a noise threshold value that prevents the noise level from falling below a specified level.

9. The audio enhancement system of claim 1, further comprising a predictive error filter connected downstream of the filter.

10. A method for enhancing the sound signal produced by an audio system in a listening environment by compensating for ambient noise in the listening environment, the method comprising:

receiving an electrical sound signal and generating a sound output from the electrical sound signal;

obtaining a total sound signal representative of the total sound level in the environment, where the total sound level comprises both the sound output from the audio system and the ambient noise within the environment;

extracting an ambient noise signal representative of the ambient noise in the environment from the total sound signal in response to the total sound signal and to a reference signal derived from the electrical sound signal, where the extracting comprises adaptive filtering with an adaptive step size;

generating a control signal in response to the ambient noise signal;

adjusting the sound output of the audio system to compensate for the ambient noise level in response to the control signal; and controlling the adaptive step size by calculating a step size;

where the extracting further comprises at least one of low-pass filtering and sample rate converting the total sound signal; and low-pass filtering and sample rate converting the reference signal.

11. The method of claim 10, where the receiving of the electrical sound signal comprises receiving at least three electrical sound signals, and the generating of the sound output comprises generating at least three sound outputs from the electrical sound signals, and where a first of the electrical sound signals comprises the reference signal, and a second and a third of the electrical sound signals are processed to provide a second reference signal.

12. The method of claim 11, where the second and the third of the electrical sound signals are processed in a reference signal calculation arrangement to provide the second reference signal.

13. The method of claim 12, where the processing of the second and the third of the electrical sound signals comprises at least one of attenuating and delaying the second and the third of the electrical sound signals, and summing of the at least one of attenuated and delayed electrical sound signals.

14. The method of claim 10, where the adjusting comprises amplifying the sound output with an amplifier.

15. The method of claim 14, where the amplifying is controlled by a gain controller.

16. The method of claim 15, further comprising scaling a signal provided by the gain controller to the amplifier to control the amplifying.

17. The method of claim 16, further comprising providing a scaling control signal to control the scaling.

18. The method of claim 17, wherein the providing of the scaling control signal comprises Dirac filtering and scaling.

19. The method of claim 15, where the gain controller comprises a noise threshold value that prevents the noise level from falling below a specified level.

20. The method of claim 10, further comprising predictive error filtering.

* * * * *